United States Patent [19]
Cole, Jr. et al.

[11] Patent Number: 5,430,305
[45] Date of Patent: Jul. 4, 1995

[54] LIGHT-INDUCED VOLTAGE ALTERATION FOR INTEGRATED CIRCUIT ANALYSIS

[75] Inventors: Edward I. Cole, Jr., Albuquerque; Jerry M. Soden, Placitas, both of N. Mex.

[73] Assignee: The United States of America as represented by the United States Department of Energy, Washington, D.C.

[21] Appl. No.: 225,021

[22] Filed: Apr. 8, 1994

[51] Int. Cl.⁶ .......................................... G01N 21/88
[52] U.S. Cl. .............................................. 250/559.07
[58] Field of Search ............... 250/562, 563, 572, 234, 250/235; 324/158 D

[56] References Cited

U.S. PATENT DOCUMENTS 4,698,587 10/1987 Burns et al. .................. 324/73 R

OTHER PUBLICATIONS

E. I. Cole, Jr. et al., "Novel Failure Analysis Techniques Using Photon Probing With a Scanning Optical Microscope" Conference Paper presented at the 1994 International Reliability Physics Symposium, San Jose, Calif. Apr. 11–14, 1994.

J. M. Soden and Richard E. Anderson "IC Failure Analysis: Techniques and Tools for Quality and Reliability Improvement," Proc. IEEE, vol. 81, pp. 703–715, May 1993.

E. I. Cole, Jr. et al. "Advanced Scanning Electron Microscopy Methods and Applications to Integrated Circuit Failure of Analysis," *Scanning Microscopy*, vol. 2, No. 1, pp. 133–150, 1988.

K. S. Wills et al., "Optical Beam Induced Current Applications for Failure Analysis of VLSI Devices," in *Proceedings of the International Symposium on Testing and Failure Analysis* [ASM, 1990], pp. 21–26.

E. Zanoni, et al., "Detection and Localization of Gate Oxide Shorts in MOS Transistors by Optical-Beam-Induced Current," *IEEE Trans. Electron. Dev.*, vol. 38, No. 2, pp. 417–419, Feb. 1991.

E. I. Cole, Jr. and R. E. Anderson, "Rapid Localization of IC Open Conductors Using Charge-Induced Voltage Alteration," Presented at the 1992 Int'l Reliability Physics Symposium, San Diego, Calif., Mar. 30–Apr. 2, 1992.

Edward I. Cole, Jr. "A New Technique for Imaging the Logic State of Passivated Conductors: Biased Resistive Contrast Imaging," in *Proceedings of the International Reliability Physics Symposium*, New Orleans, La. Mar. 27–29, 1990, pp. 45–50.

S. Gorlich and E. Kubalek, "Electron Beam Induced Damage on Passivated Metal Oxide Semiconductor Devices," *Scanning Electron Microscopy*, vol. 1, pp. 87–95, 1985.

D. J. Burns and J. M. Kendall, "Imaging Latch-Up Sites in LSI CMOS with a Laser Photoscanner," in *Proceedings of the International Reliability Physics Symposium* [IEEE, 1983], pp. 118–121.

F. J. Henley, "Logic Failure Analysis of CMOS VLSI Using a Laser Probe," in *Proceedings of the International Reliability Physics Symposium* [IEEE, 1984], pp. 69–75.

D. E. Sawyer and D. W. Berning, "Laser Scanning of MOS IC's Reveals Internal Logic States Nondestructively," *Proceedings of the IEEE*, vol. 64, pp. 393–394, Nov. 1976.

J. R. Haberer and J. J. Bart, "Charge Induced Instability in 709 Operational Amplifiers," in *Proceedings of the International Reliability Physics Symposium* [IEEE, 1972], pp. 106–111.

Primary Examiner—David C. Nelms
Assistant Examiner—Jacqueline M. Steady
Attorney, Agent, or Firm—John P. Hohimer; Gregory A. Cone

[57] ABSTRACT

An apparatus and method are described for analyzing an integrated circuit (IC), The invention uses a focused light beam that is scanned over a surface of the IC to generate a light-induced voltage alteration (LIVA) signal for analysis of the IC, The LIVA signal may be used to generate an image of the IC showing the location of any defects in the IC; and it may be further used to image and control the logic states of the IC. The invention has uses for IC failure analysis, for the development of ICs, for production-line inspection of ICs, and for qualification of ICs.

25 Claims, 13 Drawing Sheets

"PRIOR ART"

LIGHT-INDUCED VOLTAGE ALTERATION FOR INTEGRATED CIRCUIT ANALYSIS

ANALYSIS

This invention was made with Government support under Contract No. DE-AC0494AL85000 awarded by the U.S. Department of Energy. The Government has certain rights in the invention.

FIELD OF THE INVENTION

The present invention relates to the use of a scanning optical microscope for the analysis of integrated circuits (ICs), and in particular to the detection, location, and mapping of defects and logic states in an IC by scanning a focused light source over a portion of a surface of the IC to generate a light-induced voltage alteration signal that provides analysis information about the IC. The present invention may also be applied to the control of logic states in ICs for analysis purposes.

BACKGROUND OF THE INVENTION

Analysis apparatus and methods are essential for developing, manufacturing, inspecting, and qualifying ICs; and much time and effort is spent each year in the development of new and improved apparatus and methods for analyzing ICs. IC analysis includes the location, identification, and mapping of a portion or the entirety of an IC to reveal defects or logic states; and IC analysis may further include the control and switching of logic states in portions of the IC for purposes of analysis. The capability provided by IC analysis apparatus and methods is useful for gaining insight into design, manufacturing, and processing defects; and other device failure modes. IC analysis is the key to corrective action for improving the yield and reliability of ICs.

A problem in the development and manufacture of ICs is the detection of defects in the ICs. An example of a detect that IC analysis methods may be applied to is open-circuit electrical conductors in ICs. Open-circuit electrical conductors may be defined as an electrically conducting pathway or means whose ability to transfer electrical signals from one part of the IC to another part of the IC has been compromised by one or more failure mechanisms. Examples of mechanisms that can produce open-circuit electrical conductors include stress voiding, electromigration, silicon migration in contact metallization, and design and processing defects.

Another problem that IC analysis may be applied to is the identification and mapping of logic states in an IC. This logic state mapping or imaging is useful for examining the operation of one or more components of the IC for development or testing purposes, or as an aid in failure analysis. A third problem that IC analysis may be applied to is the control and switching of the logic state of one or more components of an IC for development or testing purposes, or as an aid in failure analysis.

The large effort devoted by the IC industry to analyzing ICs is indicative of the need for the development of new and improved apparatus and methods for analyzing ICs. As each succeeding generation of ICs becomes more complex with reduced feature sizes, reduced conductor line widths, and an increased number of interconnecting layers new and improved approaches to IC analysis are required.

A large number of different methods for IC analysis exist in the prior art as disclosed in the articles entitled, "IC Failure Analysis: Techniques and Tools for Quality and Reliability Improvement," by J. M. Soden and R. E. Anderson, *Proceedings of the IEEE*, Vol. 81, May 1993, pp. 703–715 and "Advanced Scanning Electron Microscopy Methods and Applications to Integrated Circuit Failure Analysis," by E. I. Cole, C. R. Bagnell Jr., B. G. Davies, A. M. Neacsu, W. V. Oxford, and R. H. Propst, *Scanning Microscopy*, Vol 2, No. 1, 1988, pp. 133–150.

Among the types of methods for IC failure analysis are active methods that measure the response of the IC to applied stimulus including electron, photon, or ion beams. Examples of active electron beam methods for IC failure analysis include electron beam induced current (EBIC), biased resistive contrast imaging (BRCI), and charge-induced voltage alteration (CIVA). A prior art active photon beam method for IC failure analysis is biased optical beam induced current (biased-OBIC). Logic levels of internal IC transistors have also been measured with active photon beam methods. These prior art methods for IC analysis are preferably practiced with the use of a scanning electron microscope (SEM) or a scanning optical microscope (SOM). The SEM or SOM preferably provides the capability for the simultaneous viewing of an image of the IC device structure with the active electron or photon beam excitation of the IC for analysis. The image of the IC device structure may then be combined with the analysis signal produced by the active electron or photon beam excitation to aid in registering the locations of the defects or logic states in the IC.

The EBIC method is used to identify defects in the device layer of an IC by generating an electron-hole current in semiconductor junctions in the IC. A disadvantage of the EBIC method is that for ICs, which preferably have a passivation layer, the primary electron beam must have sufficient energy to penetrate through the passivation layer to reach the semiconductor device layer in the IC. This penetration of the IC passivation layer requires a high-energy electron beam energy of up to 5,000 electron volts (eV) or more; and this high electron beam energy can result in radiation damage in metal-oxide-semiconductor (MOS) ICs.

Electron beam induced damage to MOS ICs is discussed in an article entitled "Electron Beam Induced Damage on Passivated Metal Oxide Semiconductor Devices," by S. Gorlich and E. Kubalek, *Scanning Electron Microscopy*, Vol. I, 1985, pp. 87–95. Electron beam induced damage to ICs is more severe for MOS ICs than for bipolar ICs due to a penetration of the primary electrons into the deep-lying gate oxide. Studies of the influence of electron irradiation not penetrating to the gate oxide on the characteristics of passivated NMOS transistors, for example, show that significant damage can occur even when the primary electrons do not penetrate to the gate oxide. This damage is due to secondary x-rays generated by the primary electrons in the passivation layer of the IC, since these x-rays penetrate into the gate oxide. The primary damage mechanism in the gate oxide is the generation of electron-hole pairs and the subsequent trapping of positive holes that then causes a change in the space charge. This change in the space charge results in a shift in the threshold voltage, $V_{th}$, of the transistor. (The threshold voltage is defined as the transistor gate voltage required to generate a specified drain-to-source current at a specified drain-to-source voltage.) Furthermore, interface states at the gate oxide boundary may be affected. Both effects are responsible for altering the device parameters.

The BRCI method generates a relative resistance map of the conductors on ICs by using the IC as a complex current divider. This method for the measurement of IC logic levels and conductor voltage levels in an IC is disclosed in a paper entitled "A New Technique for Imaging the Logic State of Passivated Conductors: Biased Resistive Contrast Imaging," by E. I. Cole Jr., presented at the 1990 International Reliability Physics Symposium, New Orleans, La., Mar. 27-29, 1990. The BRCI image is generated by monitoring small fluctuations in the power supply current of an IC as an electron beam is scanned over the IC device surface. A disadvantage of the BRCI method is that the electron beam energy is comparable to that of the EBIC method and can therefore produce radiation damage in MOS ICs.

A CIVA method employing a high-energy primary electron beam for analyzing open-circuit electrical conductors in passivated ICs (i.e. ICs having one or more insulating passivation layers for forming a surface passivation device) is disclosed in a paper entitled "Rapid Localization of IC Open Conductors Using Charge-Induced Voltage Alteration," by E. I. Cole Jr. and R. E. Anderson presented at the 1992 International Reliability Physics Symposium, San Diego, Calif., Mar. 30–Apr. 2, 1992. The CIVA method provides a fast, simple method for locating open-circuit electrical conductors, contact, and via defects in ICs. The CIVA image is generated by monitoring the voltage shifts in a constant-current power supply as a high-energy (about 5,000 eV or more for a passivated IC) electron beam is scanned over a biased IC. A disadvantage of the CIVA method is that the electron beam energy is comparable to that of the EBIC and BRCI methods and can similarly produce radiation damage in MOS ICs.

Optical methods for IC analysis use a low-energy photon beam (about 2 electron volts or less) and therefore do not produce radiation damage in MOS ICs as is generally the case for high-energy electron beam methods. Optical methods for IC analysis also do not require a vacuum system or enclosure as do electron and ion beam methods. This ability to operate in the open without a vacuum system or enclosure reduces the measurement time considerably by eliminating the vacuum pump-down and return-to-atmospheric pressure times as required with electron or ion beam methods. As a result, the analysis time for optical methods may be on the order of one minute or less as compared with a minimum of several minutes for electron or ion beam methods.

The prior art biased-OBIC method for IC failure analysis is disclosed in articles entitled "Imaging Latch-Up Sites in LSI CMOS with a Laser Photoscanner," by D. J. Burns and J. M. Kendall, in *Proceedings of the International Reliability Physics Symposium*, 1983, pp. 118–121; "Optical Beam Induced Current Applications for Failure Analysis of VLSI Devices," by K. S. Wills, T. Lewis, G. Billus, and H. Hoang, in *Proceedings of the International Symposium on Testing and Failure Analysis (ISTFA)*, 1990, pp. 21–26; and "Detection and Localization of Gate Oxide Shorts in MOS Transistors by Optical-Beam-Induced Current," by E. Zaroni, G. Spiazzi, G. D. Libera, B. Bonati, M. Muschitello, and C. Canali, *IEEE Transactions on Electronic Devices*, Vol. 38, February 1991, pp. 417–419.

The prior art biased-OBIC method is based on the use of photons to generate a photocurrent in a reverse-biased semiconductor p-n junction in an IC. The incident light is optimized for analysis by selecting a photon energy that is transparent to the passivation and underlying oxides in the IC and is absorbed by the IC substrate. The reverse-biased semiconductor p-n junction irradiated by the incident light has a photogenerated (i.e. photon generated) electrical current that is proportional to the intensity of the incident light; and this photogenerated current adds to the reverse saturation current causing the p-n junction to draw more current than under non-illuminated conditions. As the light source is scanned over the IC, the photogenerated current produces changes in the IC power supply current and this current signal provides insight into defect location. The prior art biased-OBIC method has been used to initiate latch-up conditions in complimentary metal-oxide semiconductor (CMOS) ICs to identify latch-up sensitive circuits; and it is also applicable to the detection of gate oxide short circuits and diffusion defects in ICs.

The prior art use of an active photon beam method to measure and control logic levels in transistors in an IC by the use of a visible (632.8 nm) helium-neon laser is disclosed in an article entitled "Laser Scanning of MOS IC's Reveals Internal Logic States Nondestructively," by D. E. Sawyer and D. W. Berning, *Proceedings of the IEEE*, Vol. 64, November 1976, pp. 393–394. The apparatus used for measuring and controlling transistor logic levels in an IC is similar to the prior-art biased-OBIC apparatus; and the information which describes the circuit operation is extracted by monitoring variations in the power supply current to the device. In this prior-art method, the laser light incident on the device surface of the IC could be used to change the internal logic states of the IC by increasing the laser intensity with a polarizer-analyzer combination in the optical system. This article makes no mention of the possibility or desirability of performing such logic level measurement or control by using an infrared laser beam transmitted through the IC substrate.

A second prior art use of an active photon beam method to measure and control logic levels in transistors in an IC is disclosed in an article entitled "Logic Failure Analysis of CMOS VLSI Using a Laser Probe," by F. J. Henley, in *Proceedings of the International Reliability Physics Symposium*, 1984, pp. 69–75. This second article is similar to the Sawyer et al article, except that a current-to-voltage converter (separate from the IC) is used to convert the photogenerated current signal into a voltage signal for further amplification and measurement. This second article uses a helium-neon laser incident on the device surface of the IC; and the article makes no mention of the possibility or desirability of performing such logic level measurement or control by using an infrared laser beam transmitted through the IC substrate. Blocking of the incident laser light from the device layer in the IC by the top metallization layers was known to be a problem with this prior-art method; but no solution was known or proposed other than incorporating into the IC design optical windows for nodes having 100% metal coverage (i.e. providing optical access to all the semiconductor interfaces and junctions in the IC).

The light-induced voltage alteration (LIVA) apparatus and method of the present invention is an improvement over the prior art active photon beam apparatus and methods. LIVA, in a manner similar to the prior-art active photon beam methods, uses photogenerated electron-hole pairs in a semiconductor to yield information about IC defects and functionality (i.e. logic states). When a photon beam is used to produce electron-hole pairs at or near a semiconductor interface or a semiconductor junction between regions of different doping type (e.g. a semiconductor-semiconductor interface, a semiconductor-metal interface, or a semiconductor p-n junction) in an unbiased IC, the charge carriers (electrons and holes) are separated in polarity by the built-in electrical potential between the differently doped regions that have different Fermi energy levels. For example, a CMOS transistor in the "off" state has a voltage difference (i.e. a voltage gradient) between the transistor's source and drain regions. This voltage gradient acts to separate the photogenerated electron-hole pairs to produce a photogenerated electrical current in the IC.

In the prior art biased-OBIC method and the other prior art active photon beam methods a constant-voltage power supply is used; and the photogenerated current acts to increase or decrease the current from the power supply. The small analysis current signal generated by the prior art active photon beam methods as compared to the much larger power supply bias current to the IC is disadvantageous. Furthermore, the small analysis current signal in general must be amplified in order to form an analysis image of the IC.

The LIVA analysis method of the present invention is an improvement over these prior-art methods since LIVA uses a constant-current power supply to power the IC. To maintain the voltage difference across the source and drain of a transistor in the IC supplied by the constant-current power supply, the power supply current must increase by the amount of the photogenerated current. However, since the electrical current in the constant-current supply is fixed at a constant value and cannot change in response to the photogenerated current, the power supply voltage instead increases or decreases as a result of the photogenerated current. Thus, the IC acts as its own current-to-voltage amplifier generating a large voltage change of up to several volts. The LIVA signal is this voltage change of the constant-current power supply as a light beam is scanned over a surface of the IC. In use, the LIVA signal is preferably combined with a position signal from the scanned light beam to produce a LIVA image of the IC showing the location of defects or logic states of the IC.

An advantage of the LIVA method of the present invention over the biased-OBIC and other prior art active photon beam methods is that the voltage signal generated by the LIVA method can be many orders of magnitude larger than the current signal of the prior art biased-OBIC optical method. This LIVA voltage signal may be, for example, about 2.4 volts as compared with about 80 nanoamperes current for the prior art biased-OBIC signal for a single CMOS transistor in an IC. The LIVA voltage signal is generally a sizable fraction of the operating voltage of the IC (about 5 volts).

Another advantage of the LIVA method of the present invention is that the generated voltage signal is much easier to measure than the current signal of the prior art biased-OBIC method. Voltage measurements may be made in parallel without the amplifier limitations of the current measurement. An alternating current (ac) coupled amplifier may be used with the LIVA method to overcome the dc background limitation of the prior art biased-OBIC method due to a relatively large IC bias current.

Another advantage of the LIVA method of the present invention is that it provides a high degree of selectivity for localizing and imaging defects. The LIVA method has been able to reveal defect sites in ICs that were not observable with the prior art biased-OBIC method even with current gains as large as $10^{10}$. Open circuits involving junctions can be imaged using LIVA with a selectivity and signal strength large enough to examine the entire IC die in one image.

Another advantage of the LIVA analysis method of the present invention is that it may be used with an infrared light source that may penetrate through the IC substrate to analyze an IC. This substrate surface or backside LIVA analysis is of particular advantage in ICs that are mounted in a flip-chip or substrate-up mode that restricts access to the device surface (i.e. the component surface) of the IC. This type of flip-chip mounting is becoming more prevalent for use with solder-bump technology and for the development of multichip modules. In addition, the use of a plurality of interconnection metallization layers obscures much of the component side of the IC and restricts the component side optical access to many of the IC components. The use of an optical method with an infrared light source having a photon energy chosen to allow a partial transmission through the IC substrate to the component side of the IC as in the present invention allows unrestricted access to the component semiconductor devices comprising the IC. This infrared light source also preferably has a photon energy sufficiently large for absorption by the component semiconductor junctions of the IC to produce a photogenerated electrical current signal in the IC for LIVA analysis.

These and other advantages of the LIVA method will become evident to those skilled in the art.

SUMMARY OF THE INVENTION

Accordingly, it is an object of the present invention to provide an apparatus and method for imaging and mapping defects in an IC, including open-circuit electrical conductors and open circuits with quantum-mechanical tunneling, by generating a signal voltage at the location of any semiconductor interface or junction connected to defects in the IC by means of light-induced voltage alteration.

Another object of the invention is to provide an apparatus and method for imaging and mapping the logic states in a portion of an IC for analysis purposes.

An additional object of the invention is to provide an apparatus and method for controlling and altering the logic states in an IC for analysis purposes.

Still another object of the invention is to provide an apparatus and method for the analysis of ICs that does not result in any damage to the IC.

Another object of the invention is to provide an apparatus and method for analyzing ICs that may be adapted for use with commercial scanning optical microscopes.

An additional object of the invention is to provide an apparatus and method for analyzing ICs that may be used when the IC is mounted with the device surface in contact with a heat sink or carrier or other support that prevents direct optical access to the device surface of the IC.

An additional object of the invention is to provide an apparatus and method for analyzing ICs when optical access to the device layer of the IC is obscured by opaque materials including a plurality of interconnection metallization layers in the IC.

Another object of the invention is to provide a method for analyzing ICs that may be adapted for IC production line or qualification use.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a LIVA apparatus and method are provided to analyze an IC by scanning a focused light beam over the IC to generate a photocurrent in the IC. This induced photocurrent acts to change the voltage of a constant-current power supply powering the IC, thereby generating a LIVA voltage signal (i.e. a LIVA analysis signal) that may be amplified and displayed.

In accordance with the invention, the photon beam may be a laser beam. This laser beam may be generated either by a visible or an infrared laser depending on the surface of the IC that the photon beam is incident upon and the semiconductor substrate material of the IC. For example, for a silicon IC with the photon beam incident on a device surface of the IC, a visible laser is preferably used in the invention, although an infrared laser may also be used. However, in this same example of a silicon IC a photon beam incident on a substrate surface of the IC would require the use of an infrared laser for transmission through the substrate to the device layer of the IC.

In accordance with the invention, elements of the invention including the means for generating, focusing, and scanning the photon beam; and the means for generating a position signal and a reflected light image of the IC may be provided by a scanning optical microscope.

In accordance with the invention, the use of a photon beam does not produce any damage to the ICs being tested. This enables the apparatus and method of the invention to be applied to failure analysis in IC production lines to allow failure locations and defects to be pinpointed, and reasons for certain yield reductions to be determined. It further enables the apparatus and method of the invention to be applied to the inspection and qualification of ICs received by a purchaser or user of ICs.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating a preferred embodiment of the invention and are not to be construed as limiting the invention. In the drawings.

DETAILED DESCRIPTION OF THE INVENTION

Figure 1:
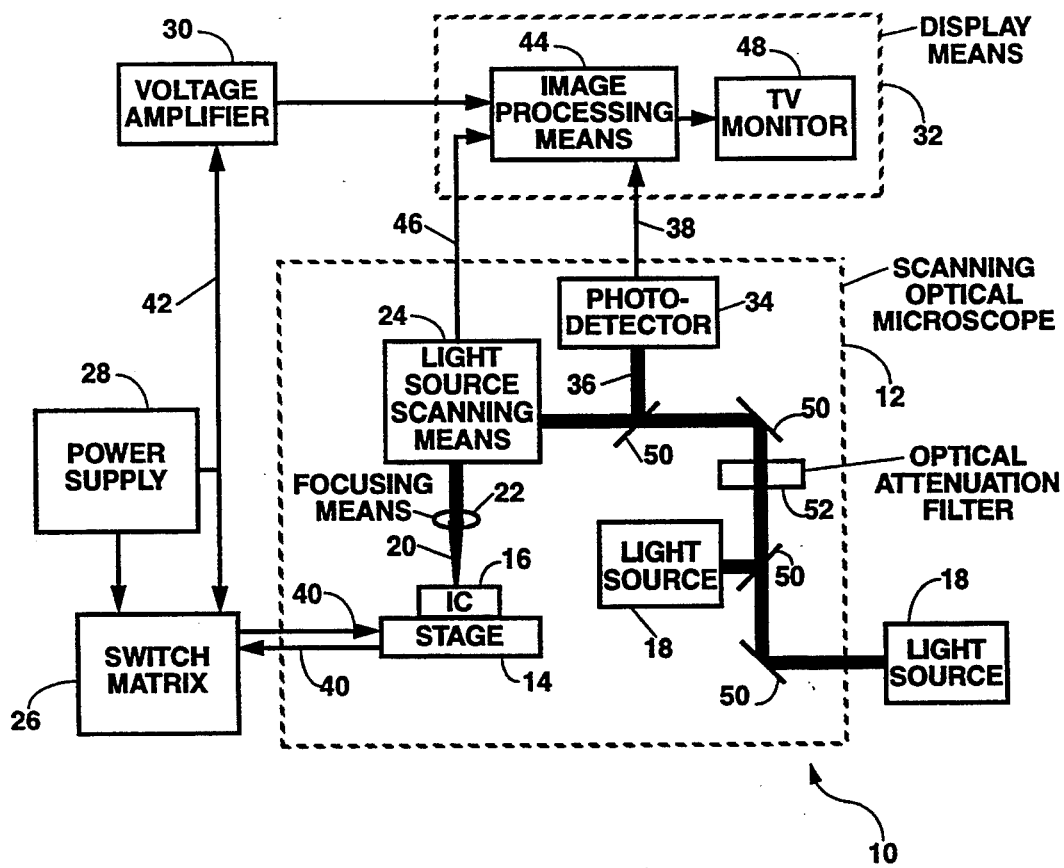
FIG. 1 shows a block diagram for an apparatus in accordance with the invention for analyzing an IC.
Figure 1:
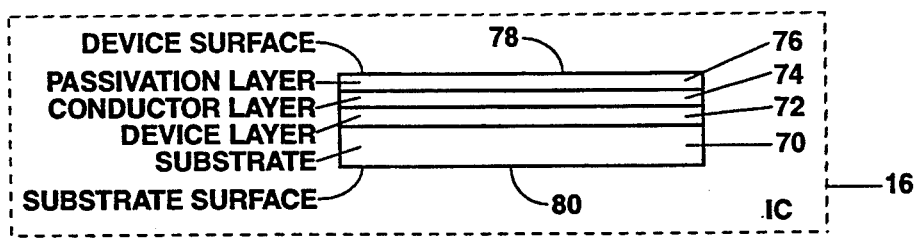

In the LIVA apparatus and method of the present invention, shown schematically in FIG. 1, images of defects or logic states in an IC are produced by monitoring the voltage fluctuations of a constant-current power supply as a focused light beam is scanned over a surface of the IC. The incident light beam produces a photogenerated electrical current near a semiconductor interface or a semiconductor junction between regions of different doping type that alters the voltage demands of the IC when a constant-current power supply is used. The changing voltage of the constant-current power supply forms the analysis signal for the LIVA apparatus and method of the present invention.

In FIG. 1, the LIVA apparatus 10 of the present invention comprises: a stage 14 for holding at least one integrated circuit 16; at least one light source 18 producing a focused light beam 20 with a focusing means 22; a light source scanning means 24, a switch matrix 26, a constant-current power supply 28, a voltage amplifier 30, and a display means 32.

FIG. 1 also shows a schematic diagram of an integrated circuit. The integrated circuit 16 consists of a semiconductor substrate 70 upon which are disposed a plurality of layers comprising at least one device layer 72 upon which at least one patterned conductor layer 74 is deposited. For passivation purposes, at least one passivation layer 76 is preferably deposited over the conductor and device layers. Multiple overlapping conductor layers may be separated and electrically insulated by additional passivation layers termed interlevel dielectric layers. The passivation layer thickness may vary from about 0.5 to 1 micron in most ICs. The passivation layer may be either undoped or lightly doped, with the light doping acting to prevent the buildup of a permanent surface charge that may affect device operation and reliability, and also to act as a getter for passivation contaminants. The outer surface 78 of the IC in FIG. 1 opposite the semiconductor substrate is termed the device surface; and the outer surface 80 proximate to the semiconductor substrate is termed the substrate surface. The device surface 78 is the upper surface of the final passivation layer in the case of a passivated IC; and it is the upper surface of the conductor or device layer or both in the case of an unpassivated or depassivated IC.

The LIVA apparatus 10 in FIG. 1 preferably comprises a scanning optical microscope 12. The scanning optical microscope 12 may comprise the stage 14, the light source 18, the focusing means 22, and the light source scanning means 24 in FIG. 1. The scanning optical microscope may be a commercial instrument as, for example, a Zeiss Laser Scan Microscope adapted for operation with the LIVA method. The scanning optical microscope 12 provides a convenient means for focusing the source of light 18 to illuminate a portion of the IC 16 and for scanning or positioning the focused source of light over the IC. In addition, the scanning optical microscope preferably comprises a photodetector 34 to measure a light beam 36 reflected from the IC 16 to produce a reflected light signal 38 for imaging the IC device. The reflected light image of the IC may also be combined with the LIVA analysis image of the IC for registration (i.e. positioning the analysis image upon the reflected light image so that the same portions and features of the IC are aligned to aid in determining the source of the variations in the LIVA voltage signal 42). Although the adaptation of a scanning optical microscope may be convenient (and cost-effective when it is already on hand for IC analysis) for the development of a LIVA instrument; it is not essential, and it may be replaced by other means for focusing and scanning the light source 18 as known to those skilled in the art. Alternatively, the focused light source 20 may remain fixed in space and the stage 14 holding the IC 16 may be moved or scanned.

For use of the LIVA apparatus and method, at least one IC 16 is placed onto the stage 14 that includes means for making electrical connections 40 to the IC. The electrical connections 40 to the IC may be routed to the IC directly through stage 14, or they may be made directly to the IC 16 (as may be required, for example, when the focused light beam 20 IC is incident of the substrate surface 80 of the IC 16). The IC 16 may be in many different forms including but not limited to a wafer form comprising a plurality of ICs on a semiconductor wafer; a die form comprised of a single IC separated from the semiconductor wafer for later mounting in a package or module or other vehicle; and a packaged form comprised of one or more die affixed to a carrier or heatsink. For analysis of a completely packaged IC, the IC lid may be removed by methods as known to the art to expose the device surface of the IC for optical access.

Electrical connections 40 to each of the various forms of ICs may be made by the use of electrical probes, chip carriers, sockets, or other means as commonly used by those skilled in the art. Electrical power for the IC is provided by a power supply 28. The power supply 28 is preferably routed through a switch matrix 26 as shown in FIG. 1 to allow the electrical connections 40 (including logic signals) to and from the IC to be controlled and reconfigured by a manual or computer-controlled switching apparatus, by a digital tester, or by other means for testing, configuring, or altering IC inputs.

The power supply 28 in FIG. 1 may be a constant-current/constant-voltage supply as, for example, a Keithley Instruments Model 236 source/measurement supply that may be operated either in a constant-current mode or a constant-voltage mode. The power supply is preferably initially configured in the constant voltage mode at a voltage in the range of operating voltages, $V_{DD}$, for the type of IC 16 being tested to determine that the IC is properly powered-up and to measure the current range suitable for LIVA analysis. For a CMOS IC, the range of operating voltages may be from about 1 volt to about 9 volts and the resultant current range may be from about 25 nanoamperes to about 250 nanoamperes. After this initial measurement is made, the power supply 28 is switched to the preferred constant current mode for LIVA analysis. The variation in the power supply voltage in response to the focused light beam 20 being scanned over a semiconductor interface or a semiconductor junction between regions of differing doping type in the IC 16 forms the LIVA voltage signal 42. The LIVA voltage signal 42 for a single transistor in an IC may be generated on a time scale of several microseconds or less; and the time scale for forming a LIVA analysis image of an entire IC may be about one minute or less depending on the complexity of the IC and the signal averaging required to obtain a desired image resolution.

The LIVA voltage signal 42 may be further separated into its alternating-current (ac) or direct-current (dc) components, with these ac and dc signals amplified by a voltage amplifier 30 prior to display. The voltage amplifier 30 may be either ac or dc coupled. If a voltage amplifier is used (for example, an Ithaco Model 1201 amplifier), the amplifier gain and frequency bandpass filters (high and low pass filters for an ac-coupled amplifier) may be used to act upon the LIVA voltage signal 42 to improve an aspect (for example, the visibility or resolution) of a displayed LIVA image. The exact gain and other parameters to be used for the voltage amplifier 30 will vary depending on the nature of the LIVA voltage signal, which may in turn depend on the particular IC type and structure that is being analyzed and the light intensity reaching the semiconductor interface or junction to photogenerate an electrical current in the IC. This light intensity reaching the semiconductor interface or junction will depend on the wavelength of the focused light beam 20, and on whether the focused light beam 20 is incident on the device surface 78 or the substrate surface 80 of the IC 16. Optical attenuation by the IC substrate 70 may act to reduce the light intensity reaching the semiconductor interface or junction when the substrate surface 80 is illuminated.

Another advantage to be gained from the use of an ac-coupled amplifier 30 is that an "over-supply" approach may be used to increase the effective bandwidth of the LIVA apparatus 10. This increase in the effective bandwidth permits a faster image acquisition and display without a loss in spatial resolution. The "over-supply" method involves increasing the power supply current in the constant-current mode well above the maximum current needed to maintain the compliance voltage of the power supply 28. The compliance voltage is preferably set at about 5 volts to prevent damage to the IC 16 from an over-voltage condition. If the power supply 28 operated in the constant-current mode had an infinite bandwidth, no LIVA voltage signal 42 would be produced under "over-supply" conditions. However, since the power ;supply 28 has bandwidth (and hence response time) limitations, there will be a momentary change in the power supply voltage as it attempts to respond to changing power demands. The LIVA voltage signal 42 may be produced by amplifying these momentary changes in the power supply voltage, with the resultant LIVA system bandwidth being determined by the response time of the power supply 28. This "over-supply" method is expected to allow the LIVA image of an entire IC die to be displayed in "real time" with the focused light beam 20 scanned over a surface of the IC at a rate of about 1 frame/second.

The display means 32 of the LIVA apparatus 10 in FIG. 1 may comprise an image processing means 44 for combining a reflected light image with the LIVA analysis image of the IC 16 for registration to aid in locating or mapping the defects or logic states. The image processing means 44 may further act to add, subtract, enhance, digitize, store, or otherwise affect the reflected light and LIVA signals. The image processing means 44 preferably generates a composite video output signal containing the position signal 46 from the light source scanning means 24 to allow the images to be displayed on a television monitor 48 or recorded electronically.

The display means 32 may be a part of a scanning optical microscope 12; or it may be a separate instrument.

In FIG. 1, the source of light 18 to illuminate a portion of the IC 16 to generate a LIVA analysis signal of the IC is preferably a laser. Lasers that have been used in the LIVA apparatus and method of the present invention include a gaseous helium-neon (He—Ne) laser operating at a wavelength of about 633 nanometers with a lasing output power of about 5 milliWatts; a gaseous He—Ne laser operating at a wavelength of about 1152 nanometers with a lasing output power of about 5 milliWatts; a solid-state neodymium-doped yttrium aluminum garnet (Nd:YAG) laser operating at a wavelength of about 1320 nanometers with a lasing output power of about 320 milliWatts; and a solid-state Nd:YAG laser operating at a wavelength of about 1064 nanometers with a lasing output power of about 1.2 Watts. Other types of lasers and light sources may be used for the LIVA method and apparatus, including other types of solid-state lasers, titanium-sapphire lasers, organic dye lasers, and semiconductor lasers.

If a scanning optical microscope 12 forms a part of the LIVA apparatus 10, the light source 18 may be either internal to the scanning optical microscope 12, or a separate component with the light beam coupled into the scanning optical microscope 12 by means of one or more mirrors 50, or a combination of the above.

The mirrors 50 used to convey the light beam from the light source 18 to the IC 16 may be either partially or totally reflecting depending upon the particular location and purpose served by each mirror in the LIVA apparatus 10. The mirrors 50 may also be highly transmitting at one wavelength of light and highly reflecting at a different wavelength of light to allow the use of a plurality of light sources 18 of differing wavelengths in the LIVA apparatus 10.

A primary requirement for the light source 18 in the LIVA apparatus 10 is that the light must have a photon energy near or above the energy bandgap of a semiconductor material comprising the semiconductor interface or semiconductor junctions in the IC in order to produce a photogenerated current in the IC. The photon energy of the light source 18 is preferably greater than or equal to the energy bandgap of the semiconductor material comprising the semiconductor interface or semiconductor junctions in the IC, although a LIVA signal may be generated at a photon energy slightly below the energy bandgap (i.e. within a few kT of the bandgap, where kT is a thermal activation energy in the semiconductor defined as the product of the Boltzmann constant and the temperature of the semiconductor).

Figure 2:
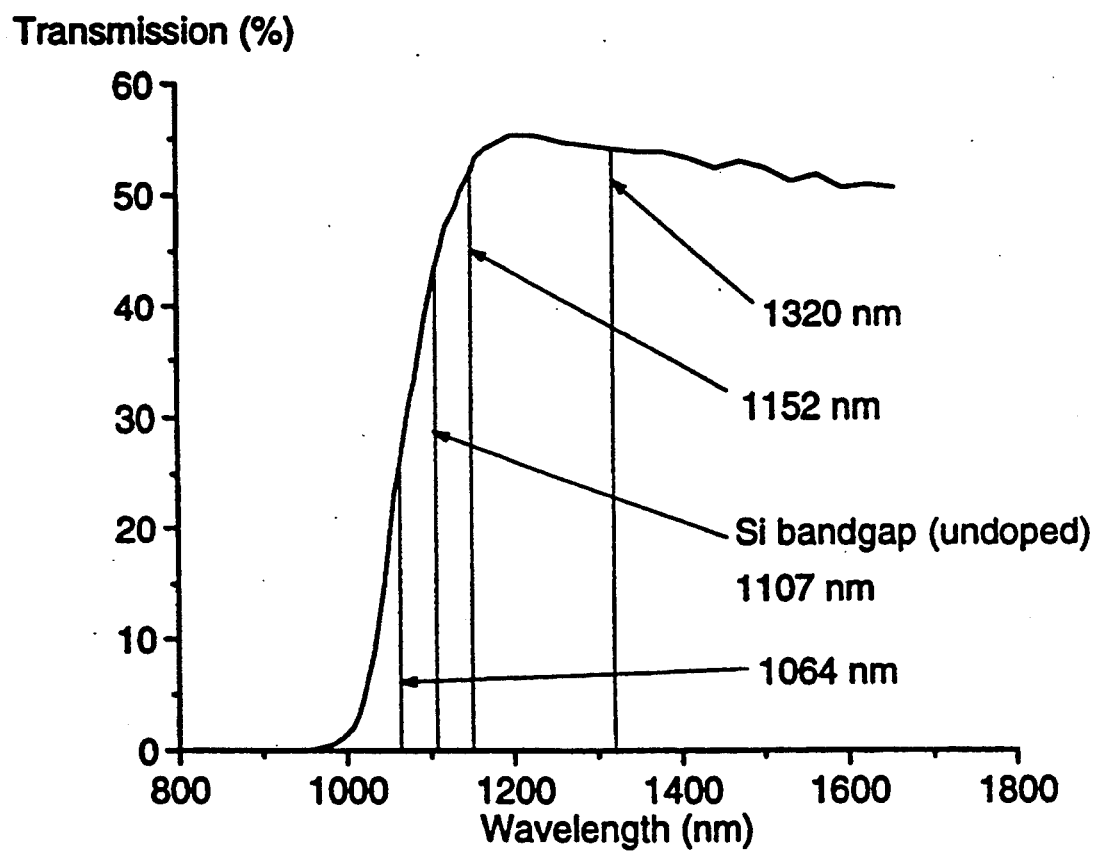
FIG. 2 shows a light transmission curve for a 625-micron-thick p⁻-doped silicon substrate and the wavelengths corresponding to the indirect energy bandgap of silicon and several infrared laser sources.

If the light source 18 is to be used to illuminate the substrate surface 80 of the IC 16 and to be transmitted through the substrate 70 to the location of a semiconductor interface or junction in the device layer 72 of the IC, then the light must have a wavelength for which the substrate 70 is sufficiently transparent to generate a measurable LIVA analysis signal 42. FIG. 2, for example, shows a light transmission curve for a 625-micron-thick $p^-$-doped silicon substrate, Also shown in the example of FIG. 2 is the energy bandgap wavelength of undoped silicon, and the wavelengths of several lasers that may be considered for providing the substrate surface illumination of the IC for LIVA analysis. The wavelengths at 1064 nanometersand 1320 nanometers correspond to an infrared Nd:YAG laser; and the wavelength at 1152 nanometers corresponds to an infrared He—Ne laser. In the example of FIG. 2 the infrared Nd:YAG laser having an emission wavelength of 1064 nanometers and the infrared He—Ne laser having an emission wavelength of 1152 nanometers would be preferred for substrate surface LIVA analysis of the IC; since these lasers may be transmitted through the $p^-$-doped silicon substrate, and they have a photon energy near or above the bandgap energy of silicon. The Nd:YAG laser having an emission wavelength of 1320 nanometers would in general not be preferred for substrate surface LIVA analysis of the IC; since although it has a high transmission through the substrate, its photon energy is well below the bandgap energy of silicon. Use of this 1320 nanometer Nd:YAG laser may produce a LIVA signal in a silicon IC; but only with considerable laser power since it is inefficient in generating an electron-hole photocurrent in the IC.

In the example of FIG. 2, other types of lasers emitting in the wavelength range of about 1050 nanometers to about 1150 nanometers may also be used for substrate surface analysis of ICs having a $p^-$-doped silicon substrate. The transmission characteristics of a semiconductor IC substrate 70 will vary depending on the substrate composition, doping type, and doping concentration. Therefore, the laser wavelengths preferred for substrate surface LIVA analysis of a particular IC 16 may be different from the above example as will become evident to those skilled in the art with practice of the present invention.

The optical power in the focused light beam 20 in FIG. 1 is preferably controlled and varied by means of an optical attenuation filter 52 located in the path of the unfocused light beam. In this way, the optical power in the focused light beam 20 may be controlled or varied. Such control is useful for adjusting the magnitude of the LIVA analysis signal 42, and for controlling and switching logic states in the IC 16. Other means can also be used to control and vary the optical power in the focused light beam 20 as known to those skilled in the art.

The light source scanning means 24 for moving the focused light beam 20 across a field of view on a surface of the IC 16 or positioning the focused light beam 20 at a particular point on the IC is preferably a pair of galvanometer-driven mirrors in an x—y arrangement. The application of electrical driving signals to these galvanometer-driven mirrors may result, for example, in a 512×512 pixel raster scan of the focused light beam 20. Alternatively, scanning as defined herein may include moving the focused light beam 20 along an axis to generate a line scan (as may be used, for example, to analyze a row of transistors or memory elements in the IC) or positioning the focused light beam 20 at a particular spot on the IC (as may be used, for example, to control a logic state in the IC). The minimum spot size is preferably diffraction limited with a diameter of a few microns when the light source 18 is a laser. Larger spot sizes may also be used, with the spot size controlled by changing the nature of the focusing means 20 or a parameter of the light source 18 (including the wavelength and the beam size if the light source 18 is a laser). The focusing means 20 may include a lens, or one or more reflecting mirrors having a radius of curvature.

In FIG. 1, a partially-transmitting mirror 50 is located in the light path between the light source scanning means 24 and the optical attenuation filter 52 to intercept a portion of the focused light beam 20 that is reflected from a surface of the IC 16 and redirected back along the light path (i.e. redirected back through the focusing means 20 and the light source scanning means 24). This reflected light beam 36 is detected by a photodetector 34 to generate a reflected light signal 38 that may be used to produce a reflected light image of the IC 16. The photodetector 34 may be a photomultiplier tube detector (if the light source 18 is a visible source as, for example, a 633 nanometer He—Ne laser), or it may be a germanium diode detector (if the light source 18 is an infrared source as, for example, an infrared laser). Other types of photodetectors 34 (including silicon photodetectors) may be used for other light sources 18; and a plurality of photodetectors 34 may be used. The photodetector 34 may also be apertured to improve the resolution of the reflected light image of the IC 16.

The light-induced voltage alteration (LIVA) apparatus and method of the present invention uses photogenerated electron-hole pairs in a semiconductor to yield information about IC defects and functionality (i.e. logic states). When a photon beam (i.e. the focused light beam 20) is used to produce electron-hole pairs at or near a semiconductor interface or a semiconductor junction between regions of different doping type (including a semiconductor-semiconductor interface, a semiconductor-metal interface, or a semiconductor p-n junction) in an unbiased IC, the charge carriers (electrons and holes) are separated by a built-in electrical potential between the differently doped regions that have different Fermi energy levels. For example, a CMOS transistor in the "off" state has a voltage difference (i.e. a voltage gradient) between the transistor's source and drain regions. This voltage gradient acts to separate the photogenerated electron-hole pairs producing a photogenerated electrical current in the IC 16.

The built-in electrical potential of a semiconductor interface or a semiconductor junction in a device layer 72 of the IC 16 is not in general affected by an open-circuit electrical conductor in a conductor layer 74 of the IC 16. However, in a biased IC, if a transistor junction is connected, for example, to an open-circuit electrical conductor that supplies power to that junction there can be a measurable effect. In the absence of photon injection by the focused light beam 20, the open-circuit semiconductor junction in the biased IC 16 will acquire a voltage due to effects including leakage currents, capacitive coupling, and charge tunneling. When exposed to the focused light beam 20, no "compensation charge" will be able to flow through the open-circuit electrical conductor to compensate for the photogenerated current and attempt to re-establish the initial bias conditions. This will result in two effects. First, the transistor in the IC 16 that is directly connected to the open-circuited electrical conductor may go into a state that requires more electrical power to be supplied by the power supply 28 (for example, the transistor may go into saturation). Second, any other transistor components connected to the open-circuit electrical conductor (for example, CMOS transistor gates) will have their voltage altered; and this change in voltage can put these transistors into states that require more electrical power to be supplied by the power supply 28. With the constant-current power supply 28 used with the LIVA apparatus and method of the present invention, the above increases in the power demand will result in a larger reduction in the power supply voltage. As a result, the LIVA voltage signal 42 resulting from open-circuit electrical conductors and other defects can be very large (by as much as 3 or 4 orders of magnitude) as compared to the LIVA voltage signal 42 for logic state identification. It is this large increase in the LIVA voltage signal that permits an entire IC die to be examined in a single image and at a rapid rate using the LIVA method of the present invention.

Figure 3:
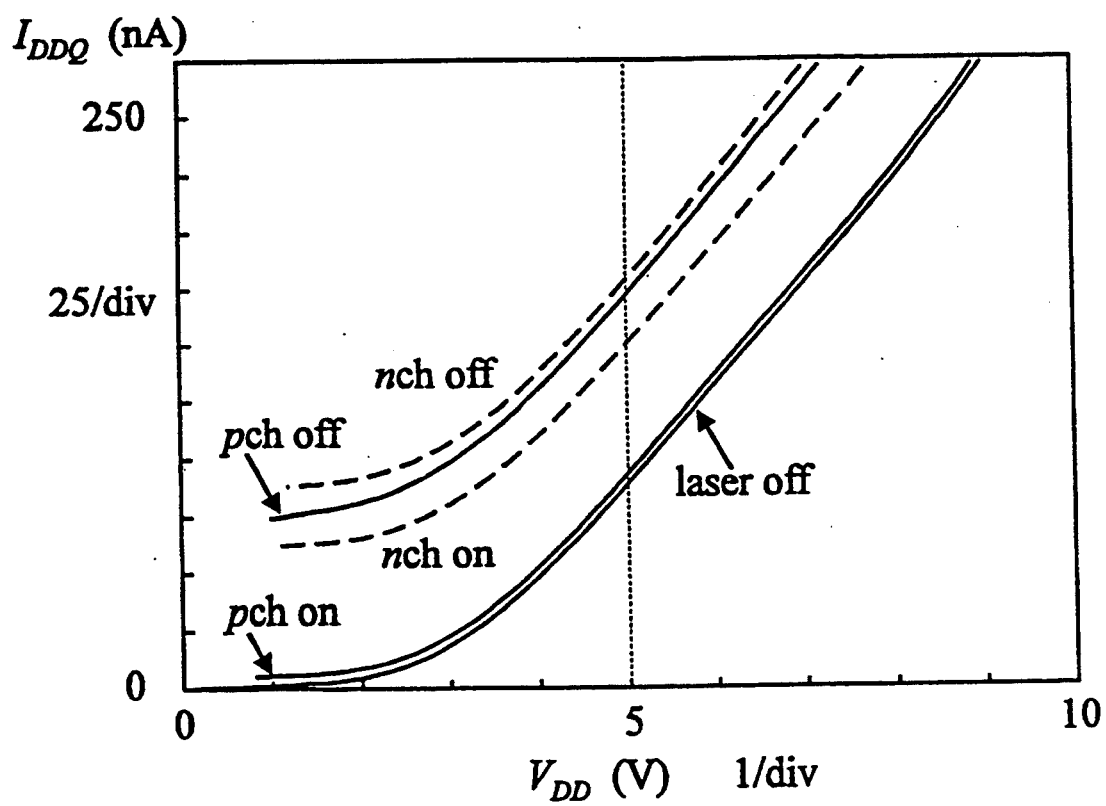
FIG. 3 shows the current-voltage characteristics of transistors in a CMOS IC generated with a constant-voltage power supply and with illumination by a focused light beam to illustrate signal generation by the prior-art biased-OBIC method.
Figure 4:
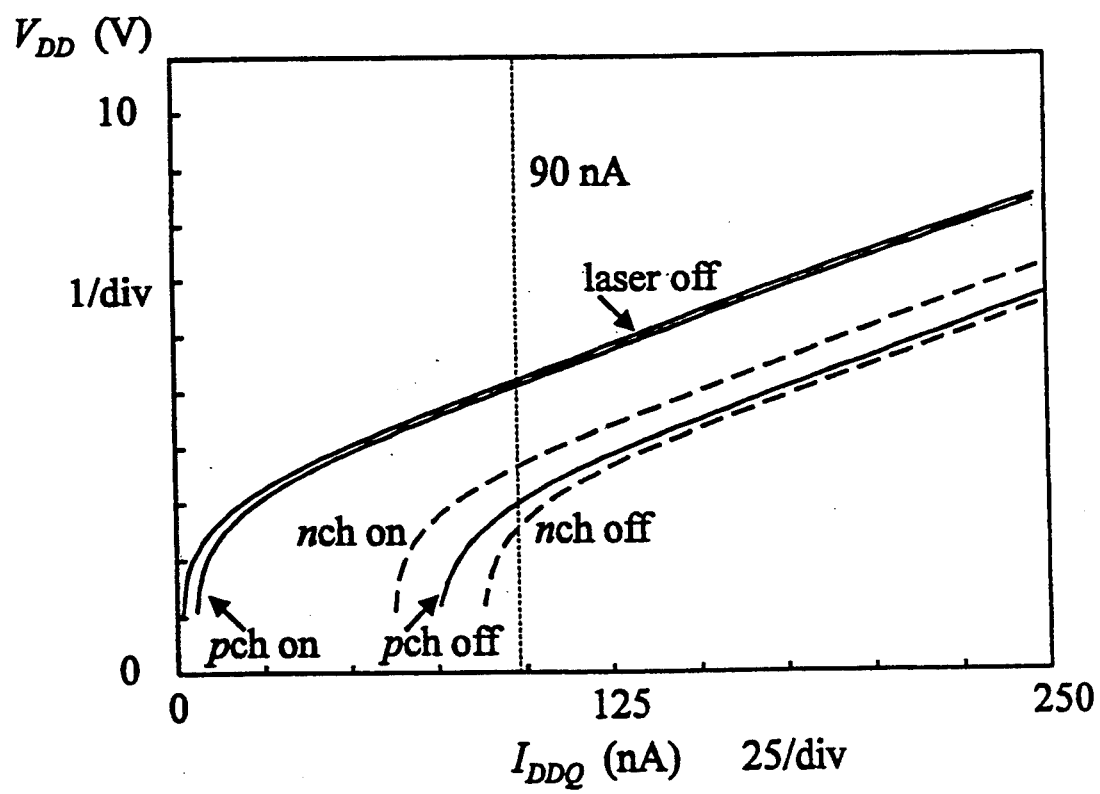
FIG. 4 shows the voltage-current characteristics of transistors in a CMOS IC generated with a constant-current power supply and with illumination by a focused light beam to illustrate signal generation by the LIVA apparatus and method of the present invention.

To illustrate the improvement and advantage of the LIVA apparatus and method of the present invention as compared to the prior-art biased-OBIC method, FIGS. 3 and 4 show the characteristics of a CMOS IC made with a p-well technology, and the response of transistors in the IC to illumination by a focused light beam. FIG. 3 shows the current-voltage (I-V) characteristics of transistors in the IC generated with a constant-voltage power supply to illustrate signal generation by the prior-art biased-OBIC method; and FIG. 4 shows the voltage-current (V-I) characteristics of transistors in the IC generated with a constant-current power supply to illustrate signal generation by the LIVA apparatus and method of the present invention.

The I-V curves in FIG. 3 were generated by operating the power supply 28 in a voltage-control mode and sweeping the IC operating voltage, $V_{DD}$, from 10 to 0 volts while the IC 16 was biased in the static burn-in configuration. [The static burn-in configuration is the static bias condition used to define which electrical inputs 40 to the IC are tied to a logically high (5 volts), low (0 volts), or floating (high electrical impedance) state when the IC is being screened under elevated temperature conditions. The exact static burn-in configuration is IC dependent; but some general rules are that the voltages on the electrical inputs 40 to the IC are static (i.e. they do not change with time) and that the IC is not in a contention state (i.e. a state which is not allowed, for example, taking the positive power input to 0 volts or attempting to read and write to the same IC pin at the same time). All the electrical connections 40 providing the IC inputs should be connected to either a logically high or low state to prevent a contention state.]In FIG. 3, separate curves were generated for the two types of transistors (p and n) and for the two logic states ("on" and "off") for each type of transistor in the IC 16. In making these measurements, the channel region (i.e. the polysilicon gate) of a single transistor in the IC was illuminated by a focused spot of 633 nm He—Ne laser light from the light source 18, with the 5 mW laser output power reduced to about 0.5 mW by a 10%-transmitting neutral density optical attenuation filter 52. At a fixed operating voltage in FIG. 3 (as, for example, at 5 volts corresponding to the dashed vertical line in FIG. 3), there is an increase in the IC operating current, $I_{DDQ}$, as a result of the photogenerated electrical current when the transistors are exposed to the focused light beam 20.

In FIG. 3, the increase in the IC operating current, $IDD_Q$, with illumination by the focused light beam 20 is greater for "off" state transistors than for "on" state transistors. When a transistor in the IC 16 is in the "off" state, there is a greater voltage between its source and drain than when the transistor is in the "on" state. This change in the voltage potential across the transistor results in a change in the carrier recombination current in the transistor and hence in the IC operating current. This difference in the IC operating current in FIG. 3 is used in the prior art to identify logic states with the biased-OBIC method.

FIG. 3 also shows that the difference in the IC operating current, $I_{DDQ}$, between the "on" and "off states is greater for p-channel transistors than for n-channel transistors. This effect is explained by considering the recombination current for p-wells in n-doped semiconductor substrates. Electron-hole pairs produced in the n-channel transistors will have a recombination current across the p-well to n-doped semiconductor substrate junction as well as a source-to-drain current. The p-well to n-doped semiconductor substrate current is independent of the IC logic state. Therefore, illuminating the n-channel transistors in the two different logic states with the focused light beam 20 will have a smaller relative effect than illuminating the p-channel transistors in different logic states.

FIG. 4 shows the V-I curves for the same transistor types and logic states of FIG. 3. In FIG. 4, the power supply 28 is operated in a current-control mode according to the present invention, with the power supply current swept from 250 to 0 nanoamperes to generate each curve. The data curves in FIG. 4 were generated by configuring and illuminating the transistors in the same manner as in FIG. 3. In FIG. 4, the decrease in the IC operating voltage, $V_{DD}$, with illumination by the focused light beam 20 is greater for "off" state transistors than for "on" state transistors. This difference in the IC operating voltage in FIG.4 is used to identity logic states by the LIVA apparatus and method of the present invention.

The change in the magnitude of the response signal to the focused light beam 20 in FIG. 3 and FIG. 4 may be compared for operation of the transistor in the IC at a given bias point. For example, in FIG. 3 at a bias voltage of 5 volts (indicated in FIG. 3 by the vertical dashed line) the transistor operating current, $I_{DDQ}$, of the "off" state p-channel transistor increases by about 80 nanoamperes (from 90 to 170 nanoamperes) as a result of exposure to the focused light beam 20 (i.e. comparing $I_{DDQ}$ of the "$P_{ch}$ off" and "laser off" curves in FIG. 3). The same transistor, when operated at a bias current of 90 nanoamperes in FIG. 4 (indicated in FIG. 4 by the vertical dashed line), shows a decrease in voltage of about 2.4 volts (from 5 to 2.6 volts) as a result of the focused light beam 20 (i.e. comparing VDD Of the "laser off" and "$P_{ch}$off" curves in FIG. 4). This large difference in the magnitude of the response signal to the focused light beam 20 (2.4 volts as compared to 80 nanoamperes) shows the improvement and advantage of the LIVA method of the present invention over the prior art biased-OBIC method; and it illustrates how the IC may be used to act as its own current to voltage amplifier during LIVA analysis. Amplification would be required to make use of the small 80 nanoampere signal for imaging and display as in the prior art biased-OBIC method.

When the LIVA method is applied to an IC 16 containing one or more localized defects, the defects under illumination by the focused light beam 20 can generate a LIVA signal 42 that is as much as three or four orders of magnitude larger than the signals would otherwise be for similar portions of the IC 16 that are not defective. The relative magnitude of the LIVA voltage signal 42 depends on the type of defect; and two primary physical mechanisms are responsible for the increase in the LIVA signal 42. First, a defect, because of its location in the IC 16 may result in an amplification of normal photogenerated currents in adjacent nondetective regions of the IC by altering the power demand of additional circuit elements electrically connected to the defective portion of the IC. Second, the defective portion of the IC is itself a site or region of enhanced carrier recombination as compared to nondefective regions.

Two types of defects illustrating the differences between these mechanisms are described with reference to FIG. 5 which shows the example of a defect that is an open-circuit defect 82 (i.e. an open-circuit electrical conductor) in an electrical conductor 84 in the conductor layer 74 of the IC 16. The first type of defect to be considered with reference to FIG. 5 results in the amplification of normal photogenerated currents in adjacent nondefective regions of the IC 16.

Figure 5:
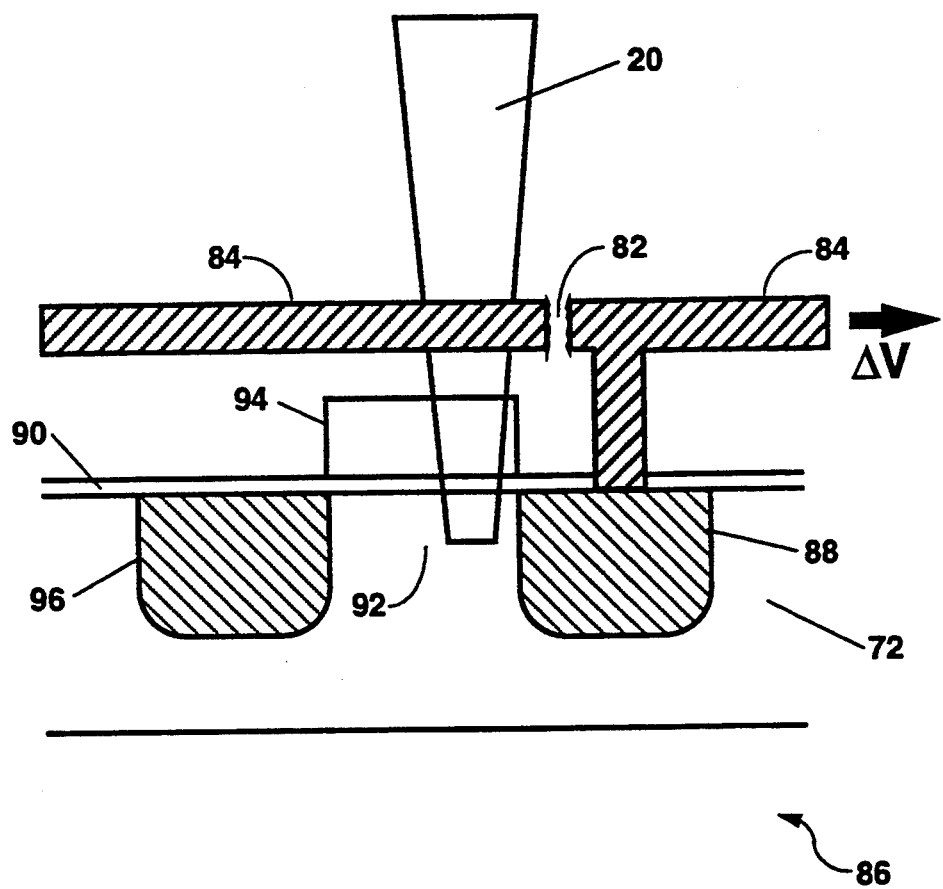
FIG. 5 shows a schematic representation illustrating the LIVA method of the present invention as applied to analyzing open-circuit defects in an IC.

FIG. 5 shows, for example, a MOS transistor 86 formed in the device layer 72 of an IC 16. The transistor 86 comprises a semiconductor source region 88, an oxide layer 90, a conducting channel 92 in the gate region 94, and a semiconductor drain region 96. Illuminating the gate region 94 in FIG. 5 with the focused light beam 20 will initially produce a normal signal in the semiconductor source region 88 of the non-deflective transistor 86; and this will result in a normal LIVA voltage signal 42 (i.e. a LIVA signal of the magnitude that would occur in the absence of any defects in the illuminated portion of the IC). This normal signal in the nondefective transistor 86 in the IC 16 will appear on the electrical conductor 84 as a change in voltage ($\Delta V$) and as a reduction in the voltage across the electrical conductor 84 at the location of the open-circuit defect 82.

In general, any transistors supplying the potential difference across the electrical conductor 84 at the location of the open-circuit defect 82 in FIG. 5 will quickly attempt to compensate for the photogenerated current and try to reestablish the initial bias conditions. If the interconnection path that supplies this "compensation charge" is an electrical conductor 84 having an open circuit defect 82, however, then no compensation may be possible due to the interrupted electrical current path, and the potential difference across the electrical conductor 84 at the location of the open-circuit defect 82 may continue to decrease with illumination by the focused light beam 20. This can put any transistors 86 directly connected to the electrical conductor 84 having the open-circuit defect 82 into saturation, further increasing the power demand of the IC 16. With the power supply 28 operated in a constant-current mode, the operating voltage, $V_{DD}$, of the transistors 86 may decrease, thereby increasing the magnitude of $\Delta V$ in FIG. 5.

In FIG. 5, the voltage on the electrical conductor 84 connected to the transistor 86 will be the same as the source region 88. Therefore, any other transistors that may be connected to the electrical conductor 84 having the open-circuit defect 82 may be driven into saturation, further amplifying the LIVA voltage signal 42. When the illumination from the focused light beam 20 ceases, the voltage across the electrical conductor 84 at the location of the open-circuit defect 82 will slowly recover to its initial equilibrium voltage which may be determined by a weak coupling to neighboring conductors, for example, by parasitic leakage conditions. (It should be noted in the foregoing discussion that the IC logic state must be such that there is a potential difference across the electrical conductor 84 at the location of the open-circuit defect 82 for the generation of a LIVA signal 42.)

If the open-circuit defect 82 in FIG. 5 has a significant amount of quantum mechanical tunneling (typical of stress voided open-circuit electrical conductors), the recovery time to the initial conditions may be much faster (on the order of milliseconds). However, a large LIVA voltage signal 42 may still be generated because the electron-hole pair recombination current at the open-circuit defect 82 can be larger than the tunneling current.

A second type of defect in an IC 16 that may result in an enhanced carrier recombination current may be due, for example, to electrostatic discharge damage (ESD) of an input protection diode in the IC 16. The changes in the local Fermi levels caused by dopant redistribution and newly formed charge leakage paths resulting from ESD will normally produce an elevated operating current, $I_{DDQ}$, even in the absence of illumination by the focused light beam 20. With illumination of the defective region of the IC 16 by the focused light beam 20, the electron-hole pair generation and recombination will result in even greater amounts of "leakage current". If the power supply 28 is operated in a constant-current mode, the result will be a change in the power supply voltage and hence a LIVA voltage signal 42. In both of the cases described, a large increase in the LIVA voltage signal 42 results from defective portions of the IC, and this LIVA signal may be detected and displayed to allow the defective portions of the IC to be located and mapped as previously described.

The LIVA apparatus and method of the present invention may be further understood with the aid of several examples as presented below. These examples are for the purpose of illustration only; and in no way do they limit the invention. Other applications and variations of the LIVA apparatus and method will become evident to those skilled in the art according to the teaching of the present invention.

EXAMPLE 1

Figure 6:
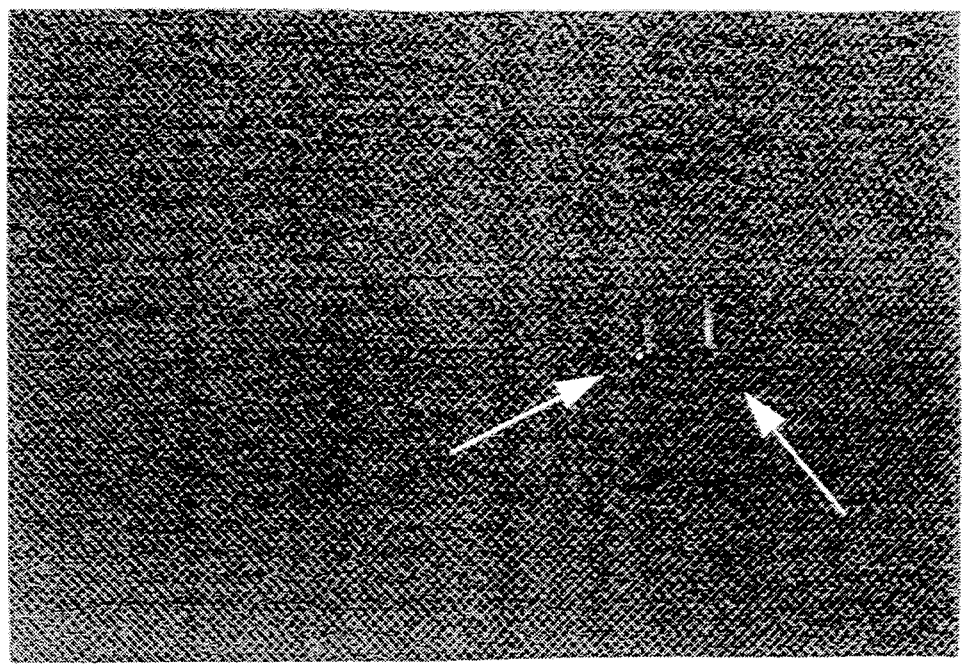
FIG. 6 shows a LIVA analysis image of an entire IC of Example 1 of the present invention, with the LIVA signals from open-circuit defects in the IC appearing as dark areas and further indicated by the arrows for clarity.

The LIVA method and apparatus has been applied to identify and map open-circuit electrical conductors in ICs, including passivated CMOS application-specific ICs (ASICs). These CMOS ASICs are of the same type as used to produce the curves in FIG. 3 and FIG. 4. For these ICs, a 633 nanometer wavelength He—Ne laser with an output power of about 5 milliWatts was used as the illumination light source 18 to generate the focused light beam 20 incident on the device surface 78 of the IC 16 to generate and acquire the LIVA images. FIG. 6 shows a LIVA scan of an entire IC die, with the LIVA signals from open-circuited conductor junctions appearing in the LIVA image as black (i.e. dark) areas (the white areas in FIG. 6 are the result of ringing in the LIVA voltage signal 42 in the ac-coupled amplifier 30). Two open-circuit defects are revealed to be present in the IC; and the defects are further indicated in FIG. 6 with highlight arrows for clarity. The absence in FIG. 6 of any other signal than the two small areas corresponding to the LIVA voltage signal from two open-circuit defects in the IC due to metallization stress voiding demonstrates the selectivity and utility of the LIVA apparatus and method of the present invention for imaging and mapping defective regions in an IC.

Figure 7:
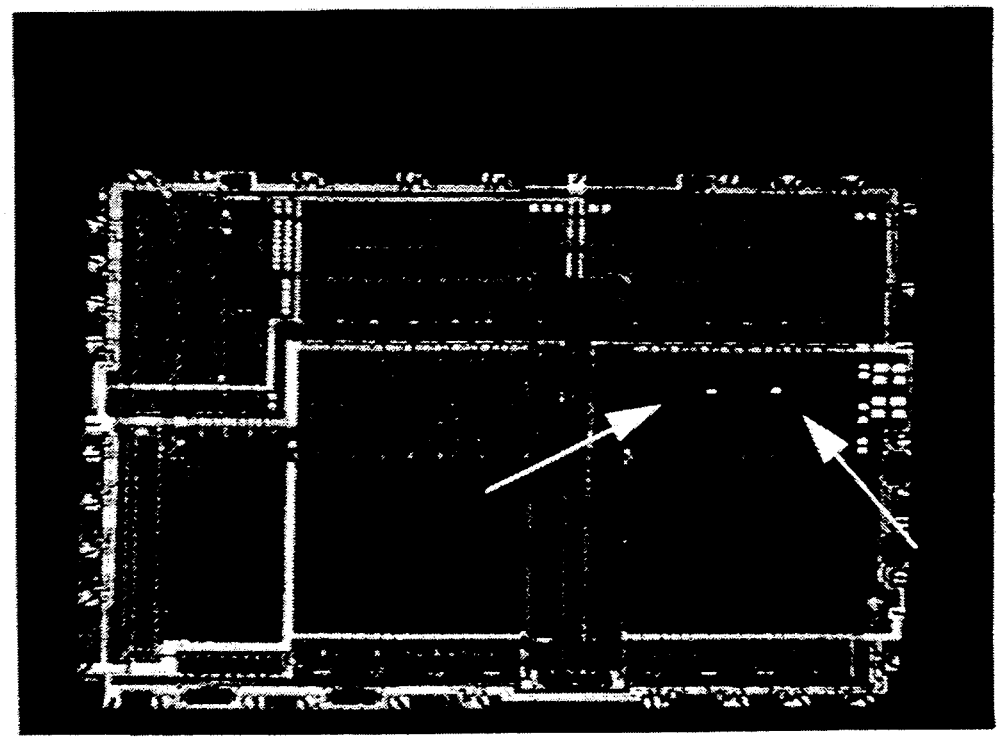
FIG. 7 shows a composite image of the IC of Example 1 of the present invention, the composite image being formed by combining the LIVA analysis image of FIG. 6 with a reflected light image for registration.

FIG. 7 shows a composite image formed by combining the LIVA image of FIG. 6 with a reflected light image of the same scanned area of the IC 16 in the image processing means 44. In this composite image in FIG. 7, the polarity of the LIVA signal 42 has been reversed so that the defects in the IC 16 appear as white areas (indicated by arrows for clarity). A separate active electron beam analysis method (charge-induced voltage alteration) performed in a vacuum chamber and utilizing a scanning electron microscope further confirmed that the LIVA images resulted from open-circuit conductors on the IC.

EXAMPLE 2

Figure 8:
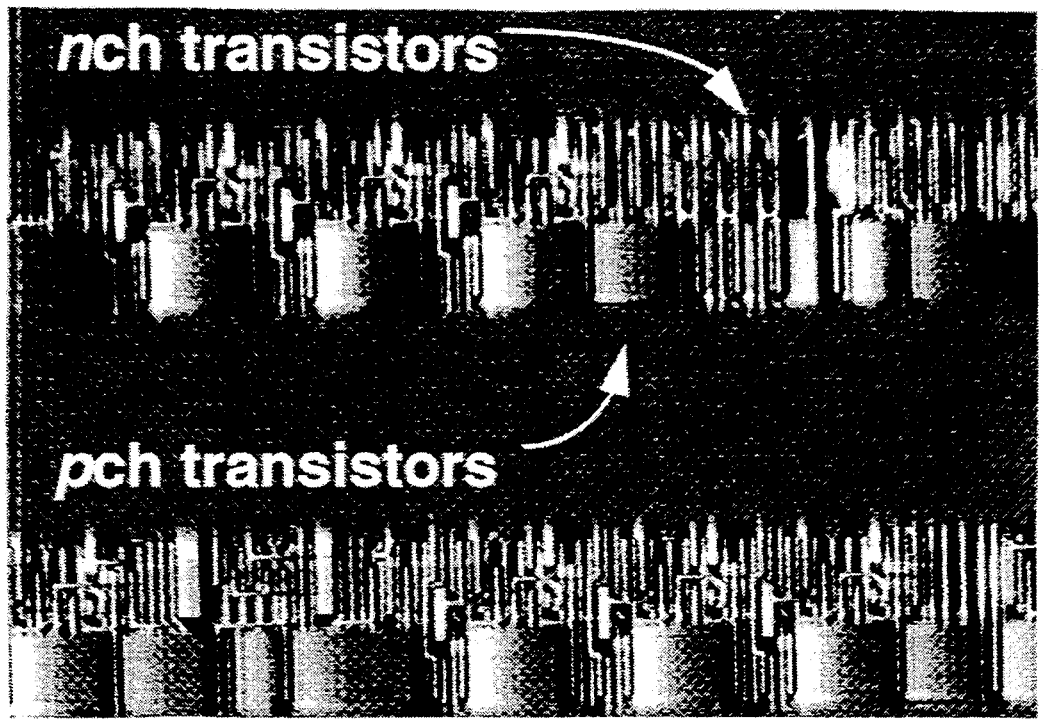
FIG. 8 shows a LIVA logic state map of Example 2 of the present invention, the LIVA logic state map showing the logic states of n-channel and p-channel transistors in a portion of a CMOS IC microprocessor.

The LIVA apparatus and method of the present invention has also been applied to identify and map logic states in ICs for analysis. FIG. 8 shows a logic state map of n-channel and p-channel transistors in cell rows in a portion of a CMOS IC microprocessor in this example. For this example, the light source 18 used to illuminate the device surface 78 of the IC 16 is a 633 nanometer wavelength He—Ne laser with an output power of about 5 milliWatts. The example of FIG. 8 illustrates how the logic states of the transistors in the IC can be identified by the LIVA apparatus and method of the present invention. The dark (black) and bright (white) areas in the LIVA image in FIG. 8 result from decreases and increases in the LIVA voltage signal 42 resulting from voltage changes in the power supply 28, respectively, as the focused light beam 20 is scanned over a portion of the IC 16. High contrast (i.e. bright) regions in FIG. 8 are produced as the focused light beam 20 is scanned across transistors in the IC that are in the "oft" state but are partially obscured from the focused light beam 20 by overlying regions of the opaque metal conductor layer 74. As shown in FIG. 4, this transition from illuminating an "off" state transistor (where the operating voltage, $V_{DD}$, is forced to become relatively low) to the case where the focused light beam 20 is prevented from reaching the semiconductor interfaces or junctions in the IC by the overlying opaque metal conductor layer 74 (where $V_{DD}$ is forced to become relatively high) results in the largest change in the LIVA voltage signal 42 and hence the highest contrast in the LIVA image in FIG. 8. This example shows the improvement of the LIVA apparatus and method of the present invention for logic state mapping over the prior art biased-OBIC method, since the LIVA method generates a larger analysis signal making the detection and imaging of logic states in an IC easier.

Figure 9:
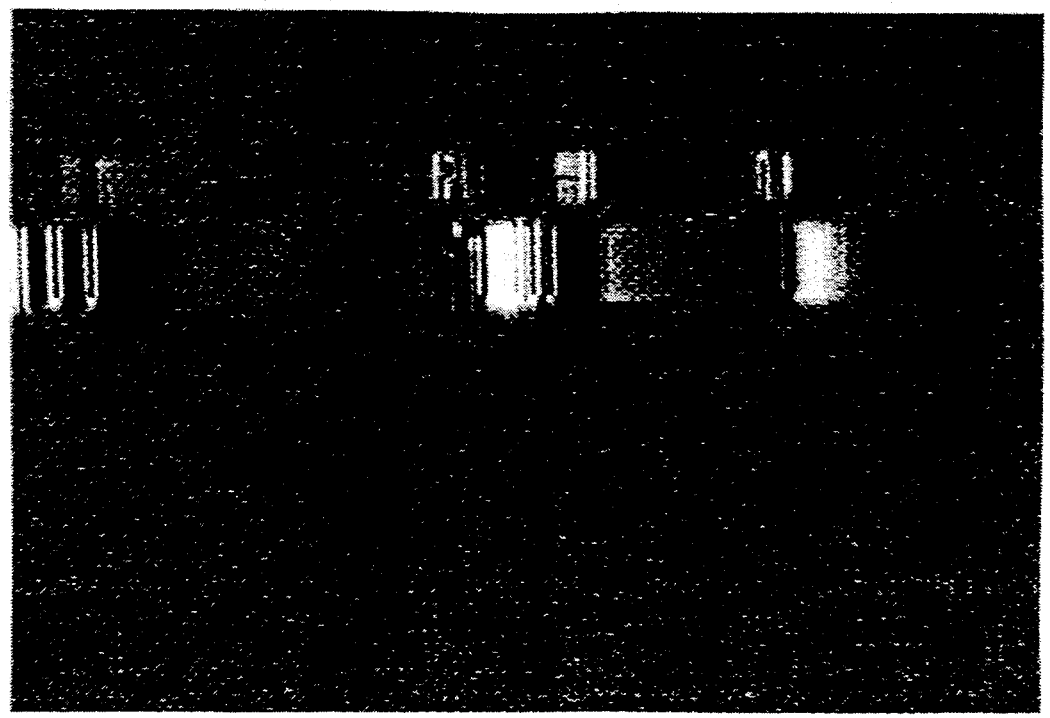
FIG. 9 shows a LIVA difference image of Example 2 of the present invention, the LIVA difference image showing only those transistors in the IC whose logic state has been changed alter a logic input signal to the IC.

In analyzing logic states in an IC, it may also be useful to display changes in the logic states to an input signal. The LIVA apparatus and method of the present invention may be used to make such measurements as shown in FIG. 9 for the same portion of the IC as the example of FIG. 8. In this mode of operation, LIVA images are recorded and stored by the display means 32 both before and alter a logic input signal to the electrical connection means 40. A difference image is then produced by the image processing means 44 by subtracting the two LIVA images (this may be done bit by bit if the images are digitized). The composite LIVA image in FIG. 9 shows only those transistors whose logic state is changed by the logic input signal to the IC. In FIG. 9, the white regions correspond to transistors whose logic state has been changed from "off" to "on" after the logic input signal, and the black regions correspond to transistors whose logic state has been changed from "on" to "off" by this same input signal. This image subtraction also results in a cancellation of those portions of the LIVA analysis signal that are common (i.e. unchanged) before and after the logic input signal.

Figure 10:
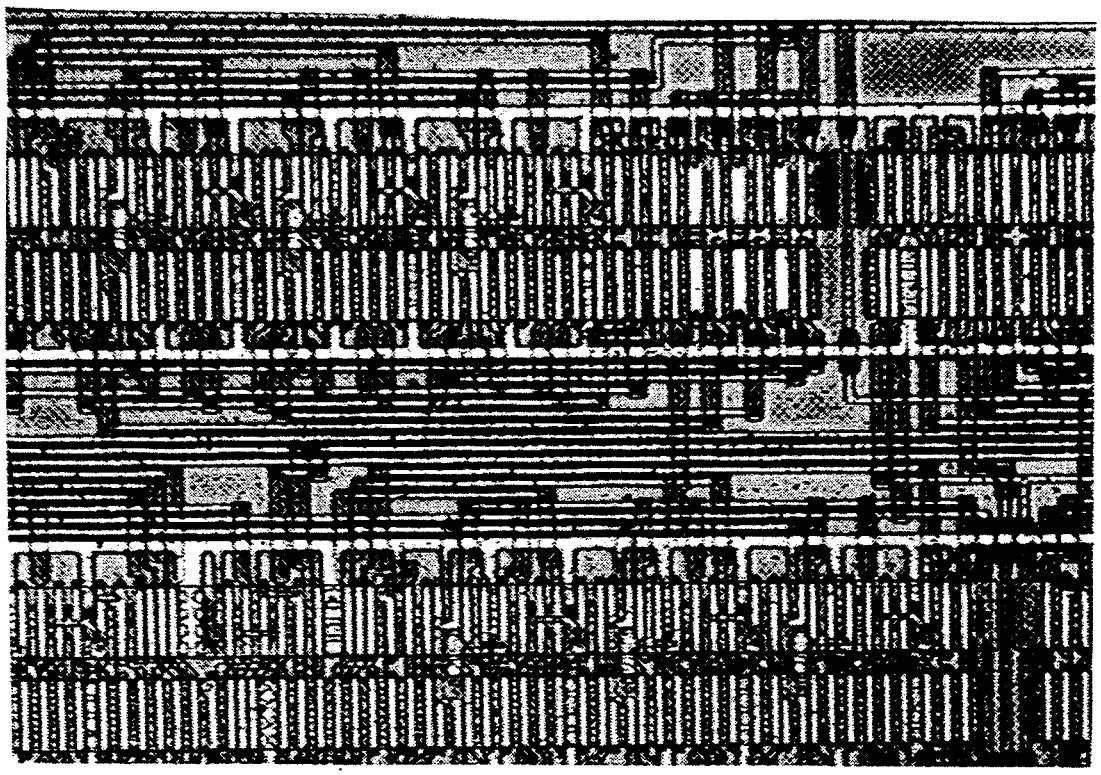
FIG. 10 shows a reflected light image of the same portion of the IC of Example 2 of the present invention for comparison.

FIG. 10 shows a reflected light image of the portion of the IC corresponding to the LIVA logic state analysis of FIGS. 8 and 9 for comparison. The partially overlying regions of the opaque metal conductors in the conductor layer 74 producing the high contrast regions in the LIVA analysis image in FIG. 8 may also be seen in FIG. 10.

EXAMPLE 3

In using the LIVA apparatus and method for analyzing an IC 16 with illumination of the device surface 78 by a focused light beam 20 there is a limitation that the focused light beam 20 must reach the semiconductor device layer 72 for the photogeneration of an electrical current. In many cases, the presence of overlying regions of opaque metal conductors in the conductor layer 74 prevent the focused light beam 20 from reaching the semiconductor device layer 72. ICs having multiple layers of overlying metal conductors in the conductor layer 74 for device interconnection or ICs mounted in a flip-chip or substrate-up arrangement that restricts optical access to the device surface 78 of the IC 16 present special difficulties for LIVA analysis when a visible light source 18 is used. These difficulties may arise from the obscuring of the light by the patterned conductor layer 74 or from absorption of the light by the semiconductor substrate 70. These difficulties, however, may be overcome by the use of an infrared (IR) light source 18 to illuminate the substrate surface 80 of the IC 16 where the problem of interfering metal conductors is absent. (For substrate surface LIVA, the substrate surface 80 is preferably polished to reduce light scattering.) If the wavelength of the IR light source 18 is properly chosen according to the teaching of the present invention, then a photogenerated current may be generated for the LIVA method.

LIVA measurements of a 64k CMOS static random access memory (SRAM) IC fabricated with a 2 micron, 2 level metal technology were performed with substrate surface illumination by an infrared light source that was a He—Ne laser operating at a wavelength of about 1152 nanometers and having an output power of about 5 milliWatts. The photon energy of the 1152 nanometer laser is just below the indirect silicon bandgap energy as shown in FIG. 2; but it is near enough for the photogeneration of an electron-hole current due to the semiconductor energy level distribution. The LIVA signal from this IC was sufficient to resolve an open input conductor in a SRAM element, although the signal was weaker than that observed for an unobstructed device surface illumination. A stronger substrate surface LIVA signal was produced from an SRAM input protection diode with ESD damage.

A second type of IC was examined with substrate surface illumination LIVA. This IC was a microcontroller made with a 1.25 micron, 2-level metal, 2-level polysilicon technology. Earlier failure analysis of this IC by another analysis method had identified open-circuit metal-1 to silicon electrical contacts resulting from a pellicle (i.e. a photomask) scratch. The contacts were completely obscured from device-surface optical examination by a metal-2 power bus.

Figure 11:
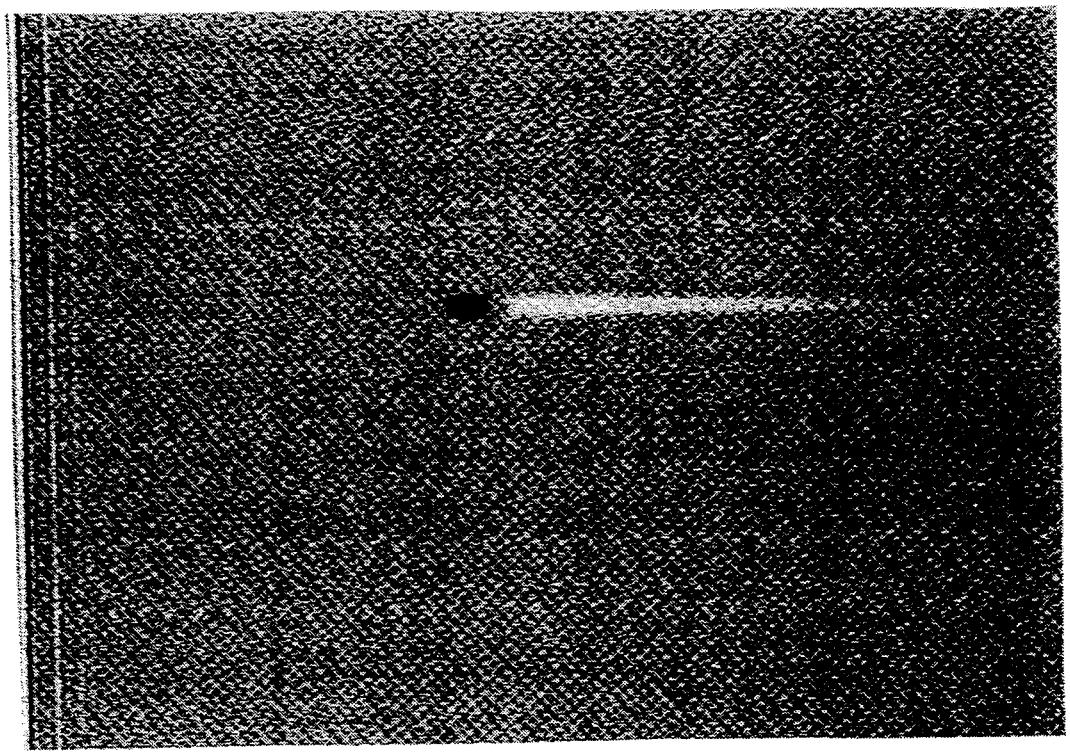
FIG. 11 shows a substrate surface infrared LIVA analysis image of Example 3 of the present invention, the LIVA image showing the open-circuit defect in the IC as a dark spot.
Figure 12:
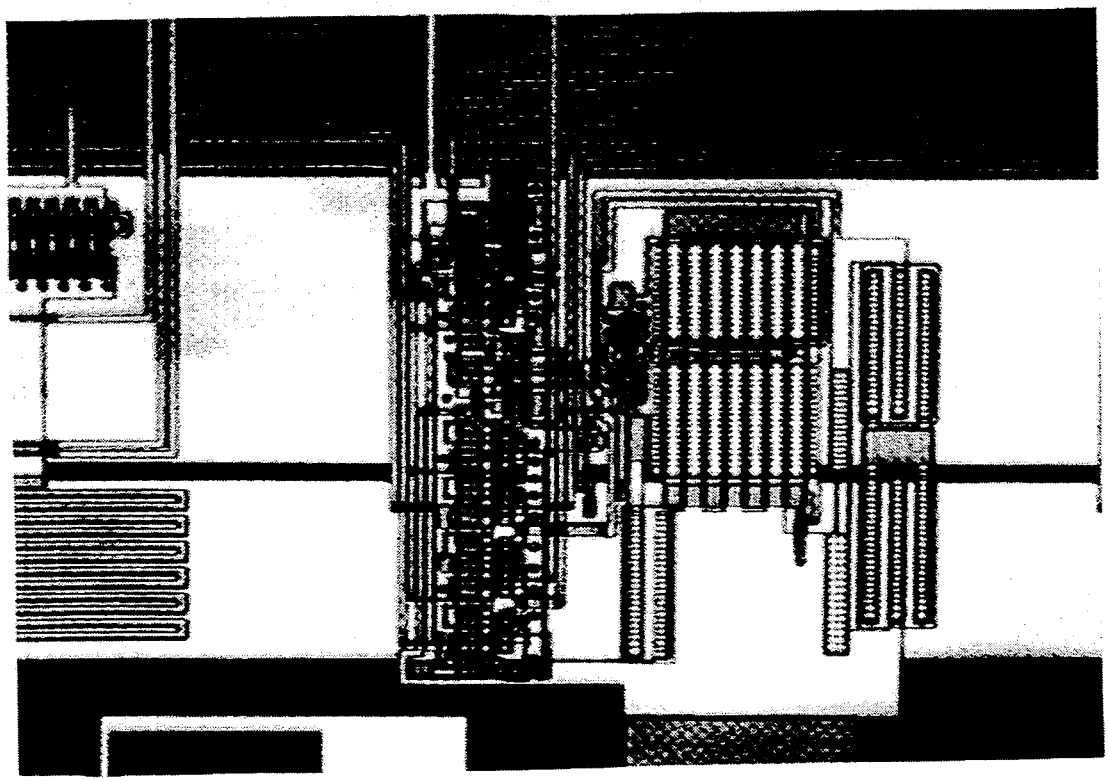
FIG. 12 shows a substrate surface infrared reflected light image of the same portion of the IC of Example 3 of the present invention for comparison.

To gain access to the substrate surface 80 of this second type of IC 16, packaged in a 40-pin ceramic dual-in-line (DIP) package, the IC package was delidded and extensions (approximately 3 inches long) to the DIP's input/output pins were mounted on the top of the package. The entire assembly was then potted in a low curing temperature (27° C.) epoxy that had a low coefficient of thermal expansion to hold the IC die in place as the backside of the ceramic package was polished to expose the substrate surface 80 of the IC 16. A substrate surface LIVA scan of the IC in FIG. 11 using the 1152 nanometer He—Ne laser source clearly shows the open-circuit defect. FIG. 12 shows a substrate surface reflected (IR) light image of the same portion of the IC with the defect for comparison. The prior art biased-OBIC method using an amplifier gain of $10^{10}$ with substrate surface illumination showed no anomalies in the IC and was unable to reveal this open-circuit defect.

EXAMPLE 4

Figure 13:
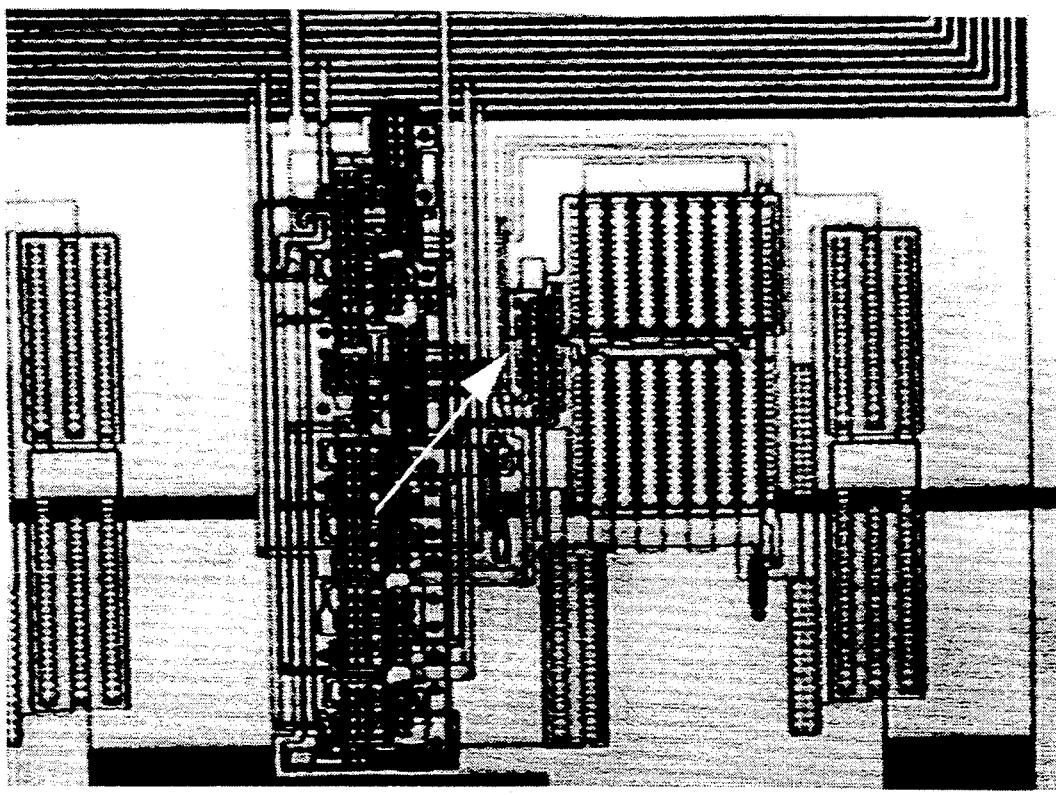
FIG. 13 shows a substrate surface infrared reflected light image of Example 4 of the present invention, the reflected light image showing an input/output structure in an IC microcontroller.
Figure 14:
FIG. 14 shows a substrate surface infrared LIVA analysis image of Example 4 of the present invention, the LIVA image showing the same portion of the IC of FIG. 13 with the input/output structure revealed to be in a logical "1" state and transistors in the "off" state appearing as dark regions in the analysis image.
Figure 15:
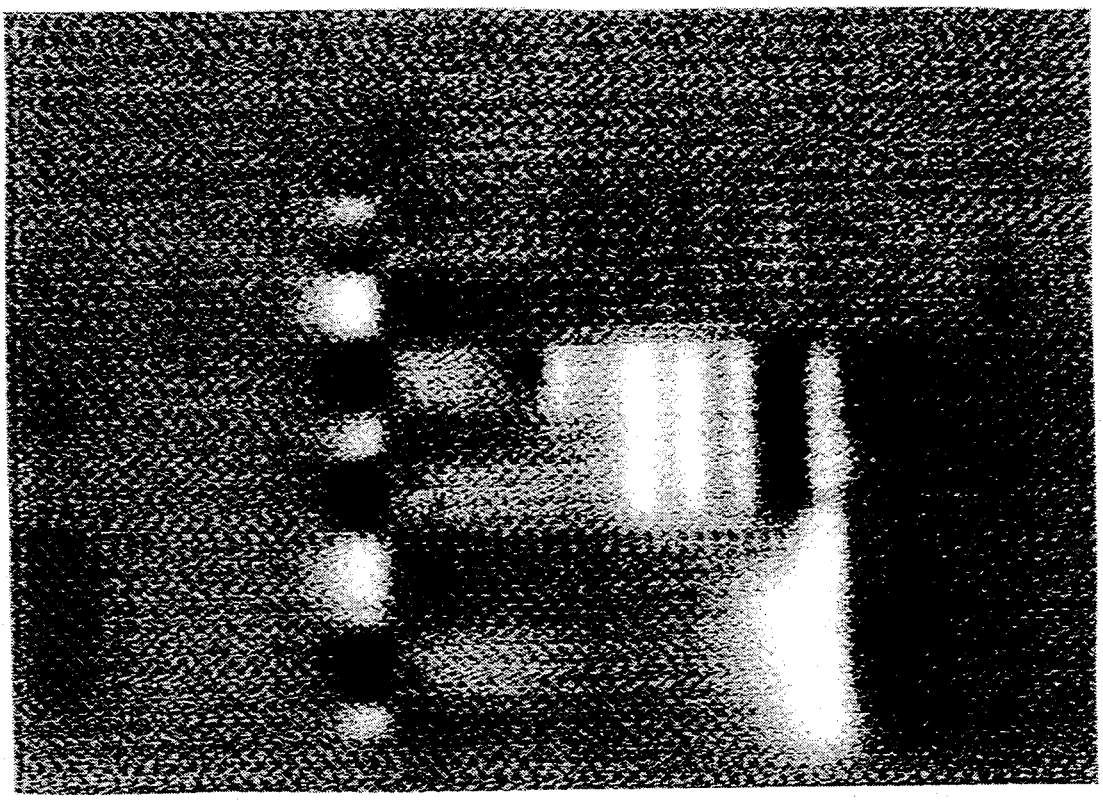
FIG. 15 shows a substrate surface infrared difference LIVA image of Example 4 of the present invention, the LIVA difference image showing the transistors that changed their logic state when the input/output structure was switched from a logical "1" state to a logical "0" state.

In order to identify and map IC logic states using the LIVA method with illumination of the substrate surface 80 of the IC 16 with a focused light beam 20, higher-power Nd:YAG lasers were used. For this purpose, the Nd:YAG laser is preferably operated at a wavelength of about 1064 nanometers since the photon energy at about 1320 nanometers is to low to produce a significant photocurrent in the IC. With the 1064 nanometer Nd:YAG laser output attenuated to about 120 milliWatts by the optical attenuation filter 52 in the LIVA apparatus 10, a substrate surface LIVA image of the logic states of the IC microcontroller of Example 3 was made. FIG. 13 shows a substrate surface reflected (IR) light image of an input/output (I/O) structure of the microcontroller of Example 3 at the slightly higher magnification used for LIVA logic analysis in this example. FIG. 14 shows the substrate surface LIVA analysis image of the same portion of the IC microcontroller with the I/O structure revealed to be in a logical "1" state. In FIG. 14, the black (i.e. dark) regions of the image correspond to transistors in the "off" state. FIG. 15 is a LIVA difference image showing the transistors that change state when the output signal of the I/O structure of the IC switches from a logical "1" state to a logical "0" state. These changes in the logic states of the IC in FIG. 15 were mapped by storing and subtracting LIVA images before and after an input signal to the IC as described heretofore for LIVA logic state analysis using device surface illumination. An advantage of the use of substrate surface LIVA imaging is that there are no bright signals from the contact metallization as in device surface LIVA imaging. This can be seen by comparing FIGS. 14 and 15 with FIG. 8.

A LIVA image of the individual CMOS memory cells of the SRAM on the microcontroller could be made by using a higher magnification lens in the focusing means 22 in the LIVA apparatus 10. This higher magnification focusing means 22 had a low numerical aperture (NA); and the lower NA resulted in a reduction in the photon intensity reaching the substrate surface 80 in the IC 16, and therefore a smaller photogenerated current. To compensate for this lower NA, the neutral density optical attenuation filter 52 was removed to allow the full optical power of about 1.2 Watts in the 1064 nanometer Nd:YAG laser to be used. A laser output power of less than the 1.2 Watts would have been sufficient to obtain a LIVA image of the individual memory cells; but the option of having a neutral density optical attenuation filter 52 with a transmission of greater than 10% was not available at the time of this measurement. An optical attenuation filter 52 in the form of a variable attenuation filter will allow the optical power in the light source 18 to be continuously varied; and this has the advantage of allowing the photon intensity reaching a surface of the IC 16 to be varied and optimized to compensate for effects including the use of a focusing means 22 having a different magnification.

Figure 16:
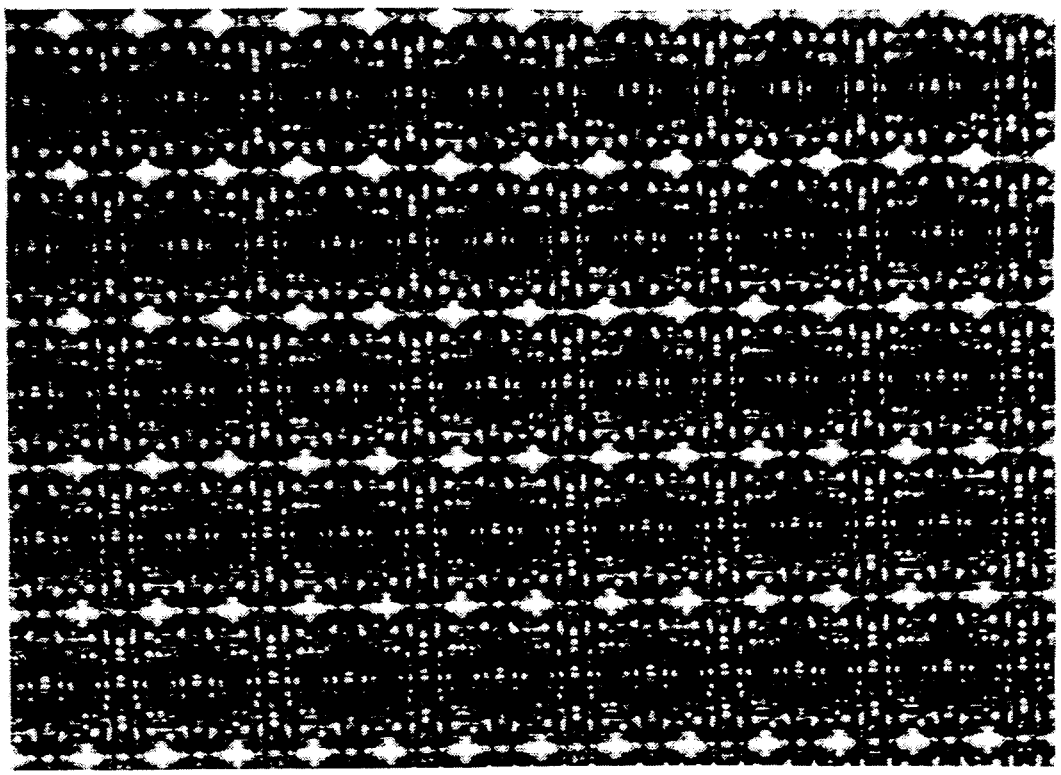
FIG. 16 shows a substrate surface infrared reflected light image of Example 4 of the present invention showing a portion of the static random access memory in an IC microcontroller.
Figure 17:
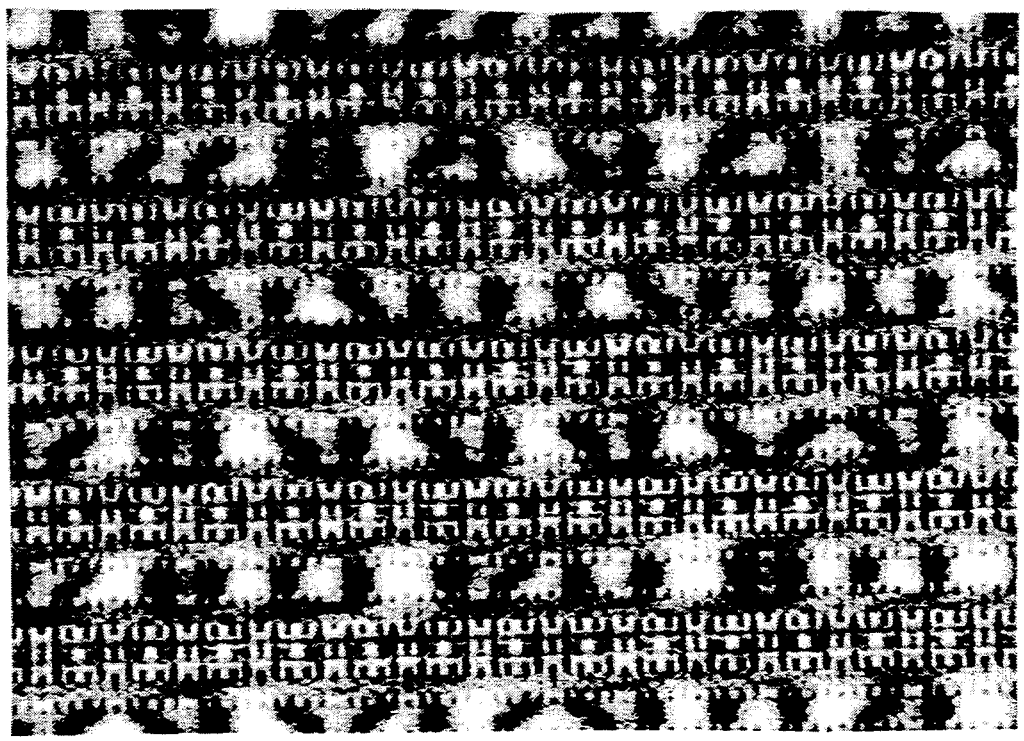
FIG. 17 shows a substrate surface infrared LIVA image of Example 4 of the present invention, the LIVA image showing the logic states of the individual memory cells in the IC with the dark spots in the image representing p-channel transistors in the logical "off" state.

Each CMOS memory cell of the SRAM in the IC microcontroller of this example is composed of 6 transistors (4 transistors in the cross-coupled inverters and 2 n-channel access transistors). This may be seen in the substrate surface reflected (IR) light image of this portion of the IC in FIG. 16. The substrate surface LIVA analysis image of the same SRAM portion of the IC microcontroller in FIG. 17 shows the logic states of the individual SRAM memory cells, allowing a logic state analysis of the SRAM in the IC. In FIG. 17, the dark areas in the LIVA analysis image correspond to p-channel transistors in the "off" state.

EXAMPLE 5

The focused light beam 20 used to analyze defects and logic states in the IC 16 may also be used to control or switch the logic state of a transistor in the IC 16. This effect of inducing enough photocurrent in a transistor to "force" the transistor "on" has been described in the prior art in the aforementioned article by D. E. Sawyer et al and also in the article by E J. Henley. However, this prior art control of logic states in an IC was limited to illumination of a device surface by a visible light source. In the prior art as represented by the above articles, there is no mention of the possibility or desirability of performing logic state control as in the present invention that uses an infrared light source 18 incident on the substrate surface 80 of the IC 16 and transmitted through the substrate 70 to the semiconductor interfaces and junctions in the device layer 72 of the IC.

In IC logic state control by a focused light beam 20 as described herein, it should be noted that if the transistor is driven internally by a second transistor that can override the photon-induced logic state control, then such logic state control will in general not be possible and the logic state will be determined by that second transistor.

As previously mentioned, a disadvantage of the prior art methods of controlling or switching the logic state of a transistor in an IC with illumination of a device surface with a visible light source is that device surface optical access to the transistor may be restricted by the presence of overlying metal conductors.

Figure 18:
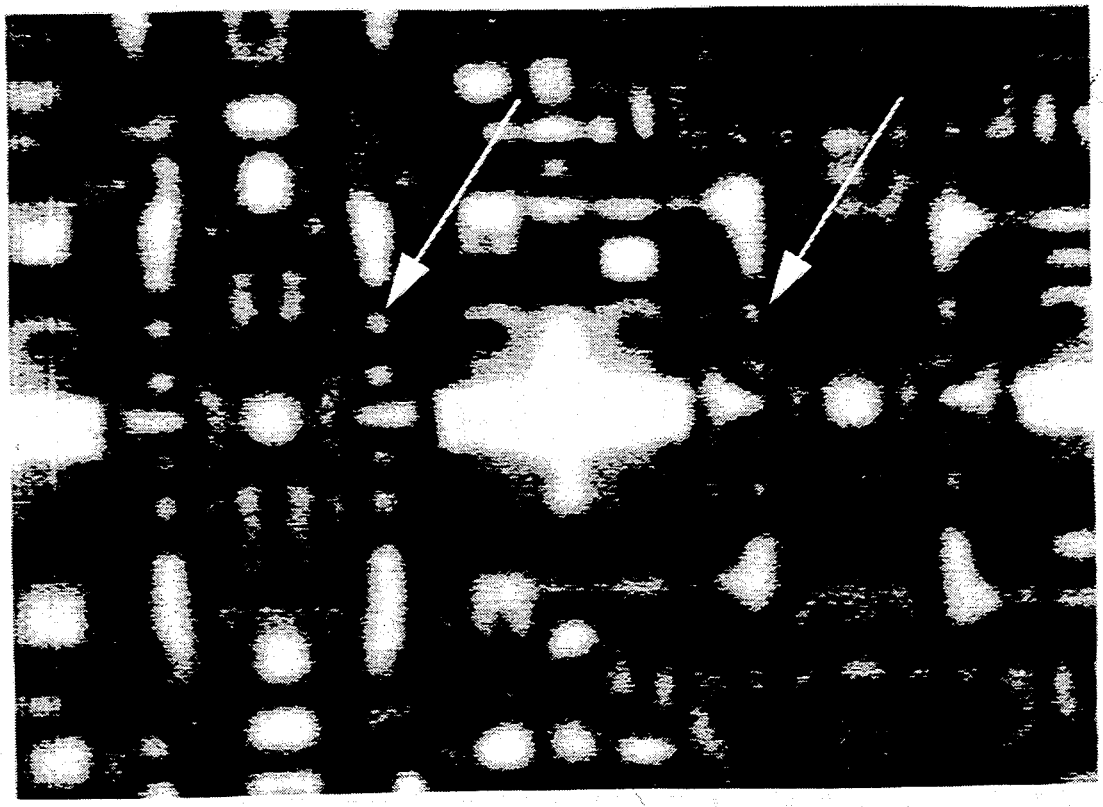
FIG. 18 shows a substrate surface reflected (IR) light image 40 of Example 5 of the present invention with two p-channel gate regions indicated by arrows, the LIVA apparatus being capable of setting the memory state in a memory cell of the IC by illuminating one of the p-channel gate regions as the IC is powered up.

An example of the use of the LIVA apparatus and method of the present invention for logic state control in an IC with substrate surface 80 illumination with an infrared light source 18 is provided herein. The same CMOS SRAM memory cell of Example 4 was used with a precise control of the areas of the IC to be illuminated achieved by operating the light source scanning means 24 in a focused spot mode at the desired memory cell location. A more highly magnified view of a portion of the SRAM memory cell in the IC is shown in FIG. 18, with two p-channel gate regions indicated by arrows. By illuminating only one p-channel gate region in a SRAM memory cell, that transistor could repeatedly be switched to an "on" state at IC power-up, effectively setting that particular SRAM memory bit in the IC microcontroller.

Another demonstration of logic control by IR illumination with this same microcontroller was made using a p-channel transistor in a half latch circuit that holds the logic state of the input/output port when tristated. By illuminating the active gate region of this transistor through the substrate surface 80 with the IR laser focused light beam 20 during power-up, the input/output structure was forced into a logical "1" state. The absence of illumination by the IR laser focused light beam 20 during the power-up state produced either a logical "1" or a logical "0", with a preference for the logical "0" state.

The LIVA apparatus and method as disclosed herein may also be applied to ICs formed from other semiconductor materials including but not limited to III–V semiconductors including gallium arsenide. Other applications and variations of the LIVA apparatus and method will become evident to those skilled in the art.

What is claimed is:

1. An apparatus for analyzing an integrated circuit formed from a semiconductor, the apparatus comprising:
    (a) a stage for holding the integrated circuit and making a plurality of electrical connections thereto;
    (b) at least one source of light having a photon energy near or above an energy bandgap of the semiconductor;
    (c) a means for focusing the source of incident light to illuminate a portion of a surface of the integrated circuit, the incident light producing a photogenerated electrical current in the integrated circuit;
    (d) means for scanning the focused source of incident light over the surface of the integrated circuit, the scanning means further comprising a position signal;
    (e) a constant-current electrical source connected to the stage to supply power to the integrated circuit, the constant-current source further comprising a signal voltage that changes in response to the photogenerated electrical current in the integrated circuit produced by the focused source of incident light, whereby the integrated circuit is analyzed.

2. The apparatus in claim 1 further comprising a photodetector for forming a reflected light image of the integrated circuit.

3. The apparatus in claim 2 further comprising a display means for forming a composite image of the integrated circuit, the display means comprising a plurality of electrical inputs, the electrical inputs further comprising the signal voltage, the position signal, and a reflected light signal from the photodetector.

4. The apparatus in claim 1 further comprising a microscope.

5. The apparatus in claim 1 further comprising a switch matrix for controlling the electrical connections to the integrated circuit.

6. The apparatus in claim 5 in which the switch matrix is computer controlled.

7. The apparatus in claim 1 in which the source of light is a laser.

8. The apparatus in claim 7 in which the laser is chosen from the group consisting of heliumneon lasers, solid-state lasers, titanium sapphire lasers, dye lasers, and semiconductor lasers.

9. The apparatus in claim 8 in which the solid-state laser is a neodymium-doped yttrium aluminum garnet laser.

10. The apparatus in claim 1 further comprising a voltage amplifier for amplifying the signal voltage.

11. The apparatus in claim 10 in which the voltage amplifier is an ac-coupled voltage amplifier.

12. The apparatus in claim 1 in which the illuminated surface of the integrated circuit is a device surface.

13. The apparatus in claim 1 in which the illuminated surface of the integrated circuit is a substrate surface.

14. A method for analyzing an integrated circuit formed from a semiconductor, comprising the steps of:
    (a) placing at least one integrated circuit on a stage, the stage making a plurality of electrical connections to the integrated circuit;
    (b) irradiating a portion of a surface of the integrated circuit with a focused source of incident light, the source of incident light having a photon energy near or above an energy bandgap of the semiconductor.
    (c) scanning the focused source of incident light over the surface of the integrated circuit with a scanning means, the scanning means providing a position signal;
    (d) supplying power to the integrated circuit with a constant-current electrical source connected to the stage, the constant-current source providing a signal voltage that changes in response to the photogenerated electrical current in the integrated circuit produced by the focused source of incident light, whereby the integrated circuit is analyzed.

15. The method in claim 14 further comprising generating an analysis image of the integrated circuit with a display means, the image representing a plurality of electrical inputs, the electrical inputs further comprising the signal voltage and the position signal.

16. The method in claim 15 further comprising generating a composite image of the integrated circuit with a display means, the composite image comprising the analysis image and a reflected light image of the integrated circuit generated from a photodetector electrical input to the display means.

17. The method in claim 14 further comprising controlling the electrical connections to the integrated circuit with a switch matrix.

18. The method in claim 17 in which the switch matrix is computer controlled.

19. The method in claim 14 in which the source of light is a laser.

20. The method in claim 19 in which the laser is chosen from the group consisting of helium-neon lasers, solid-state lasers, titanium sapphire lasers, dye lasers, and semiconductor lasers.

21. The method in claim 20 in which the solid-state laser is a neodymium-doped yttrium aluminum garnet laser.

22. The method in claim 14 further comprising amplifying the signal voltage with a voltage amplifier.

23. The method in claim 22 in which the voltage amplifier is computer controlled.

24. The method in claim 14 in which the illuminated surface of the integrated circuit is a device surface.

25. The method in claim 14 in which the illuminated surface of the integrated circuit is a substrate surface.

* * * * *